United States Patent
Tuan et al.

(10) Patent No.: US 7,477,073 B1
(45) Date of Patent: Jan. 13, 2009

(54) STRUCTURES AND METHODS FOR HETEROGENEOUS LOW POWER PROGRAMMABLE LOGIC DEVICE

(75) Inventors: Tim Tuan, San Jose, CA (US); Arifur Rahman, San Jose, CA (US); Satyaki Das, Los Gatos, CA (US); Sean W. Kao, South Pasadena, CA (US)

(73) Assignee: XILINX, Inc., San Jose, CA (US)

( * ) Notice: Subject to any disclaimer, the term of this patent is extended or adjusted under 35 U.S.C. 154(b) by 134 days.

(21) Appl. No.: 11/454,316

(22) Filed: Jun. 16, 2006

(51) Int. Cl.
*H03K 19/177* (2006.01)
*H03K 19/0175* (2006.01)

(52) U.S. Cl. .............................. 326/41; 326/101; 326/63
(58) Field of Classification Search .................... 326/38, 326/39, 41, 63, 80, 81, 101
See application file for complete search history.

(56) References Cited

U.S. PATENT DOCUMENTS

| | | | |
|---|---|---|---|
| 6,911,853 B2 | 6/2005 | Kizer et al. | |
| 6,930,510 B2 * | 8/2005 | New | 326/41 |
| 6,952,123 B2 | 10/2005 | Kizer et al. | |
| 6,960,934 B2 * | 11/2005 | New | 326/38 |
| 6,992,505 B1 | 1/2006 | Zhou | |
| 7,046,056 B2 | 5/2006 | Kizer et al. | |
| 7,081,782 B2 | 7/2006 | Kizer et al. | |
| 7,138,828 B2 * | 11/2006 | New | 326/41 |
| 2004/0174187 A1 * | 9/2004 | New | 326/41 |
| 2005/0039155 A1 | 2/2005 | New | |
| 2005/0040851 A1 | 2/2005 | New | |

OTHER PUBLICATIONS

U.S. Appl. No. 11/390,925, filed Mar. 28, 2006, Rahut et al.
U.S. Appl. No. 11/454,315, Rahman et al., filed Jun. 16, 2006, "Level-Shifting Pass Gate Multiplexer", Xilinx, Inc. 2100 Logic Drive, San Jose, CA 95124.

* cited by examiner

*Primary Examiner*—Daniel D Chang
(74) *Attorney, Agent, or Firm*—William L. Paradice, III

(57) ABSTRACT

A PLD utilizes a heterogeneous architecture to reduce power consumption of its active resources. The PLD's programmable resources are divided into a first partition and a second partition, where the resources of the first partition are optimized for low power consumption and the resources of the second partition are optimized for high performance. Portions of a user design containing non-critical timing paths are mapped to and implemented by the resources of the power-optimized first partition, and portions of the user design containing critical timing paths are mapped to and implemented by the resources of the performance-optimized second partition.

17 Claims, 16 Drawing Sheets

STRUCTURES AND METHODS FOR HETEROGENEOUS LOW POWER PROGRAMMABLE LOGIC DEVICE

FIELD OF INVENTION

This invention relates generally to integrated circuit (IC) devices and in particular to reducing power consumption of programmable logic devices.

DESCRIPTION OF RELATED ART

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

PLDs such as an FPGA typically exhibit greater static power consumption than dedicated logic devices such as standard-cell application specific integrated circuits (ASICs). One reason for the PLD's higher power consumption is because while the PLD utilizes only a subset of its available resources for any given design, the unused resources nevertheless consume static power. As a result, PLDs are sometimes not suitable for low-power applications such as, for example, portable devices.

To reduce power consumption, some PLDs may be logically subdivided into a plurality of separate programmable logic blocks, each of which may include any number of the PLD's resources (e.g., CLBs, IOBs, block RAMs, and so on) and may be selectively disabled during operation of the PLD. In this manner, resources that are not used by a particular user design and/or resources that have been inactive for a predetermined time period may be disabled by de-coupling the resources from the operating voltage, thereby reducing overall power consumption of the PLD.

Although effective in reducing power consumption, such techniques are limited to disabling PLD resources that are either unused by a particular user design or that are inactive for a predetermined time period. More specifically, such techniques do not address reducing the power consumption of PLD resources that are active during normal operation.

Thus, there is a need to reduce the power consumed by the PLD's active resources.

SUMMARY

A programmable logic device (PLD) is disclosed that utilizes a heterogeneous architecture to reduce power consumption of its active resources. In accordance with the present invention, a PLD's programmable resources are divided into a first partition and a second partition, where the resources of the first partition are optimized for low power consumption and the resources of the second partition are optimized for high performance. Portions of a user design containing non-critical timing paths are mapped to and implemented by the resources of the power-optimized first partition, and portions of the user design containing critical timing paths are mapped to and implemented by the resources of the performance-optimized second partition. In this manner, power consumption is reduced by implementing the first portion of the user design in the power-optimized first partition of the PLD, and performance is not degraded by implementing the second portion of the user design in the performance-optimized second partition of the PLD.

For first embodiments of the present invention, the resources of the first partition are powered by a low supply voltage to minimize power consumption of the first partition, and the resources of the second partition are powered by a high supply voltage to maximize performance of the second partition. For second embodiments of the present invention, the resources of the first partition are implemented by transistors fabricated to exhibit low power consumption, and the resources of the second partition are implemented by transistors fabricated to exhibit fast switching speeds and short gate delays.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of an exemplary PLD architecture for simplicity only. It is to be understood that present embodiments are equally applicable to other PLD architectures such as FPGAs and complex PLDs, and to other types of integrated circuits. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Figure 1:
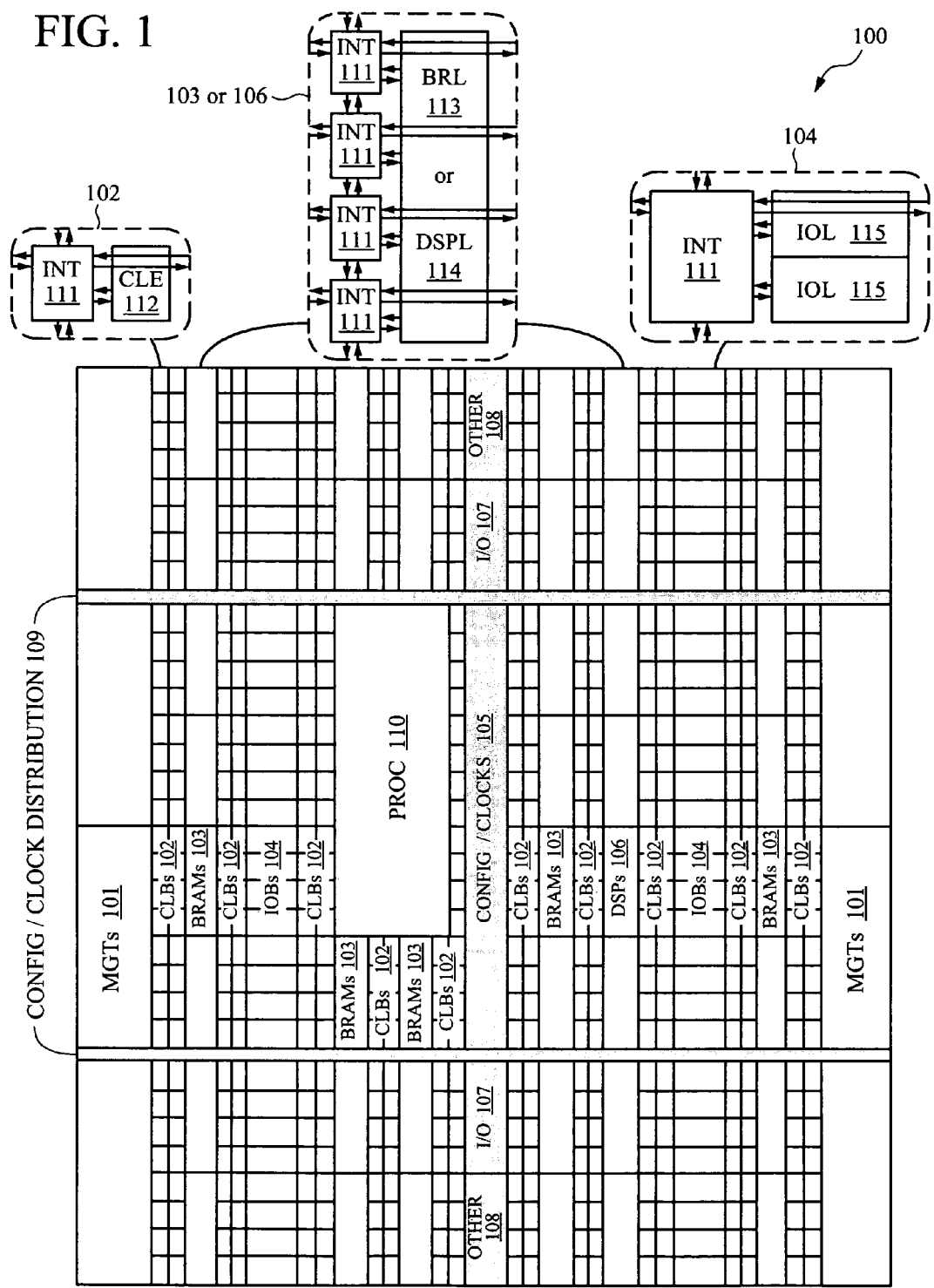
FIG. 1 is a block diagram of an FPGA within which some embodiments of the present invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
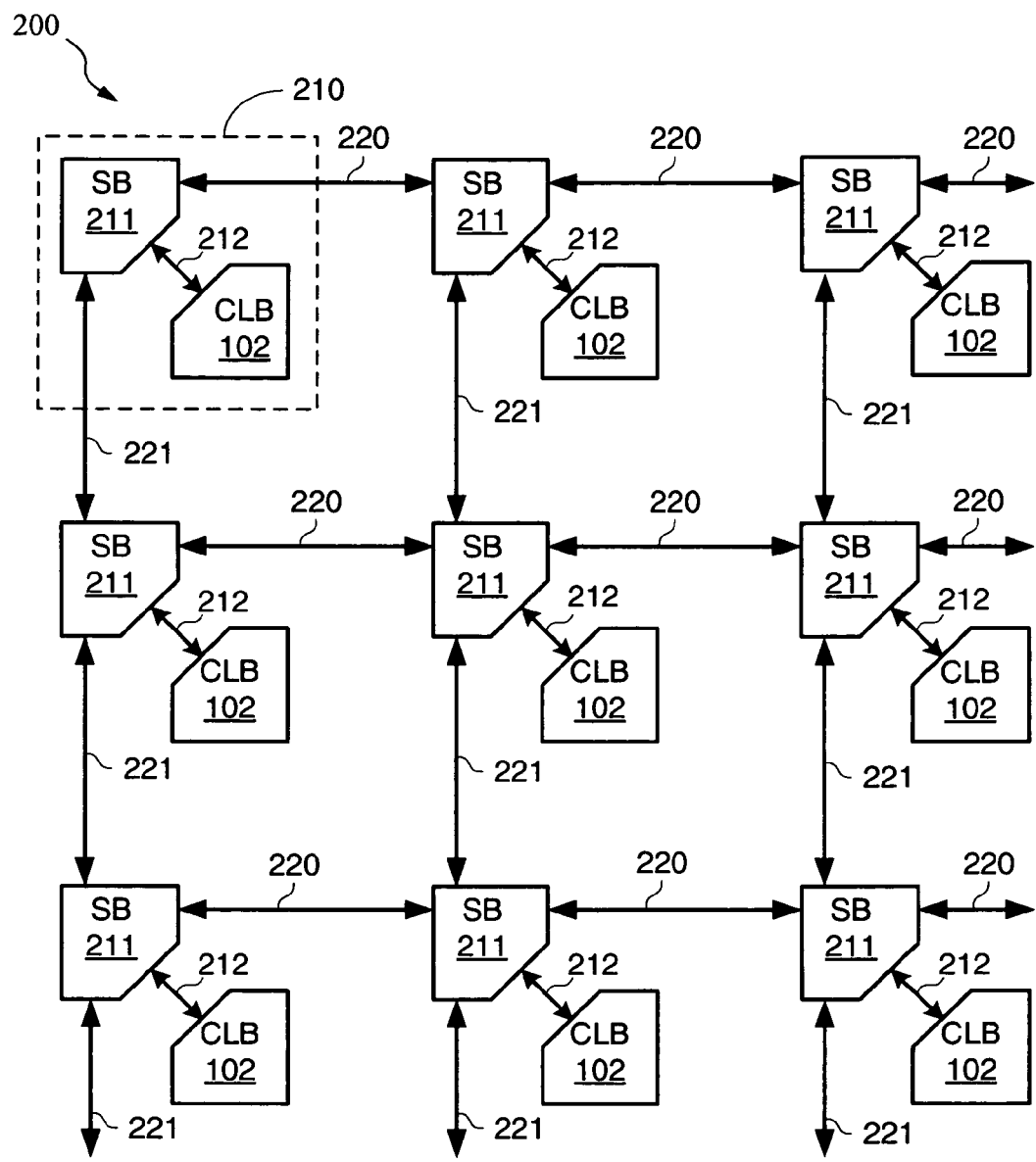
FIG. 2 is a simplified functional block diagram of a portion of the FPGA of FIG. 1.

FIG. 2 shows an exemplary portion 200 of FPGA 100 in more detail. FPGA portion 200 is shown to include an array of repeatable tiles 210, each including a well-known switch block 211 and a CLB 102 coupled together by a plurality of signal lines 212. The switch blocks 211 in similar rows are coupled to each other by a plurality of single-length signal lines 220, and the switch blocks 211 in similar columns are coupled to each other by a plurality of single-length signal lines 221. For simplicity, signal lines 212, 220, and 221 are represented collectively in FIG. 2. Although not shown for simplicity, the FPGA portion 200 may include other signal lines (e.g., double-length signal lines, quad-length signal lines, hex-length signal lines, global signal lines, and the like) that extend across multiple tiles 210 to selectively interconnect switch blocks 211 via a plurality of programmable interconnect points (PIPs). Together, the switch blocks 211, signal lines 220-221, and the PIPs form the programmable interconnect of FPGA portion 200. Further, although not shown in FIG. 2 for simplicity, FPGA 200 may include direct signal lines connected between adjacent CLBs 102 so that data may be exchanged between adjacent CLBs 102 without using the programmable interconnect.

As known in the art, each CLB 102 includes various well-known components (e.g., look-up tables (LUTs), registers, flip-flops, multiplexers, and the like) that can be programmed to implement a desired logic function by configuration data stored in associated configuration memory cells (not shown for simplicity), and each switch block 211 includes various well-known components (e.g., registers, flip-flops, multiplexers, and the like) that can be programmed to implement a desired signal routing function by configuration data stored in associated configuration memory cells (not shown for simplicity).

Figure 3:
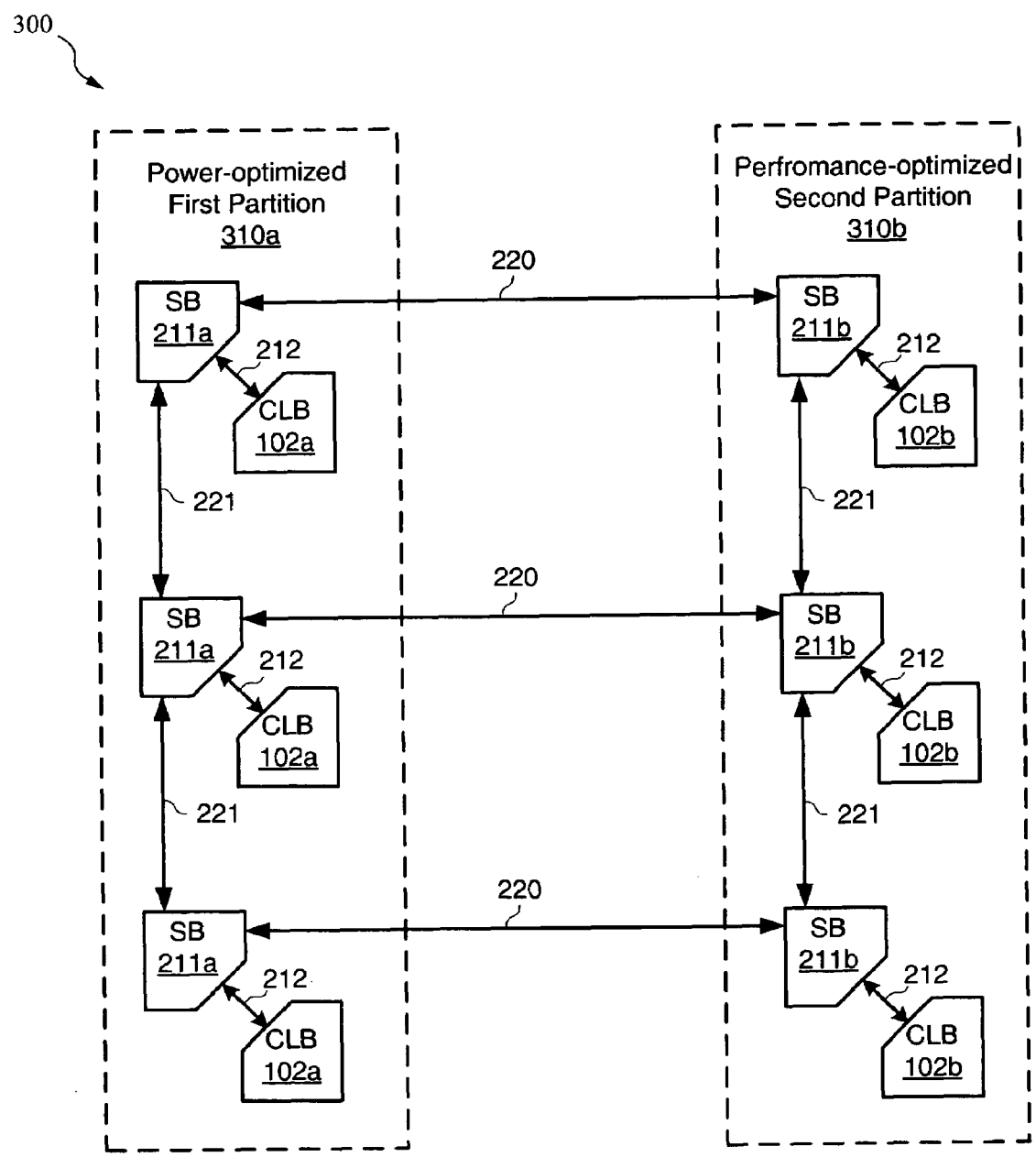
FIG. 3 is a simplified block diagram illustrating the logical subdivision of the PLD into a power-optimized first partition and a performance-optimized second partition in accordance with the present invention.

FIG. 3 shows a simplified functional block diagram of a PLD 300 that is generally representative of embodiments of the present invention. In accordance with the present invention, the PLD's resources are divided into a first partition 310a and a second partition 310b, where the first partition is optimized for low-power consumption and the second partition 310b is optimized for high-performance (e.g., for speed). As a result, the resources of the first partition 310a will have relatively low performance (e.g., as compared to the resources of the second partition 310b), and the resources of the second partition 310b will have relatively high power consumption (e.g., as compared to the resources of the first partition 310a), as will be recognized by those of skill in the art. For simplicity, the first partition 310a is shown to include one column having three tiles of CLBs 102a and switch blocks 211a, and the second partition 310b is shown to include one column having three tiles of CLBs 102b and switch blocks 211b. For actual embodiments, each partition 310a-310b may include any number of columns, each of which may include any number of tiles. Further, for simplicity, other well-known components of FPGA 300 (e.g., IOBs, GCM (global clock management) circuits, block RAM, and so on) that may be included in partition 310a and/or partition 310b are not shown in FIG. 3.

By utilizing a heterogeneous architecture in which the CLBs 102a and switch blocks 211a of the first partition 310a are optimized for low power consumption and the CLBs 102b and switch blocks 211b of the second partition 310b are optimized for performance, embodiments of the present invention may consume less power than a conventional PLD having a homogenous architecture in which all CLBs 102 and switch blocks 211 exhibit similar performance and similar power consumption without sacrificing performance. For example, a user design to be implemented in PLD 300 is logically divided into a first portion containing non-critical timing paths and into a second portion containing critical timing paths. Then, during configuration of PLD 300, the non-critical timing logic associated with the first portion of the user design is implemented in the power-optimized resources of the first partition 310a, and the critical timing logic associated with the second portion of the user design is implemented in the performance-optimized resources of the second partition 310b. Because the first portion of the user design does not contain critical timing paths, implementing the first portion of the user design in the power-optimized resources of the first partition 310a may reduce overall power consumption of PLD 300 without adversely affecting performance. Further, because all the critical timing paths of the user design may be implemented within the second partition 310b, level-shifting translation stages are not required between critical timing nets of the user design, thereby conserving valuable circuit area.

Figure 4:
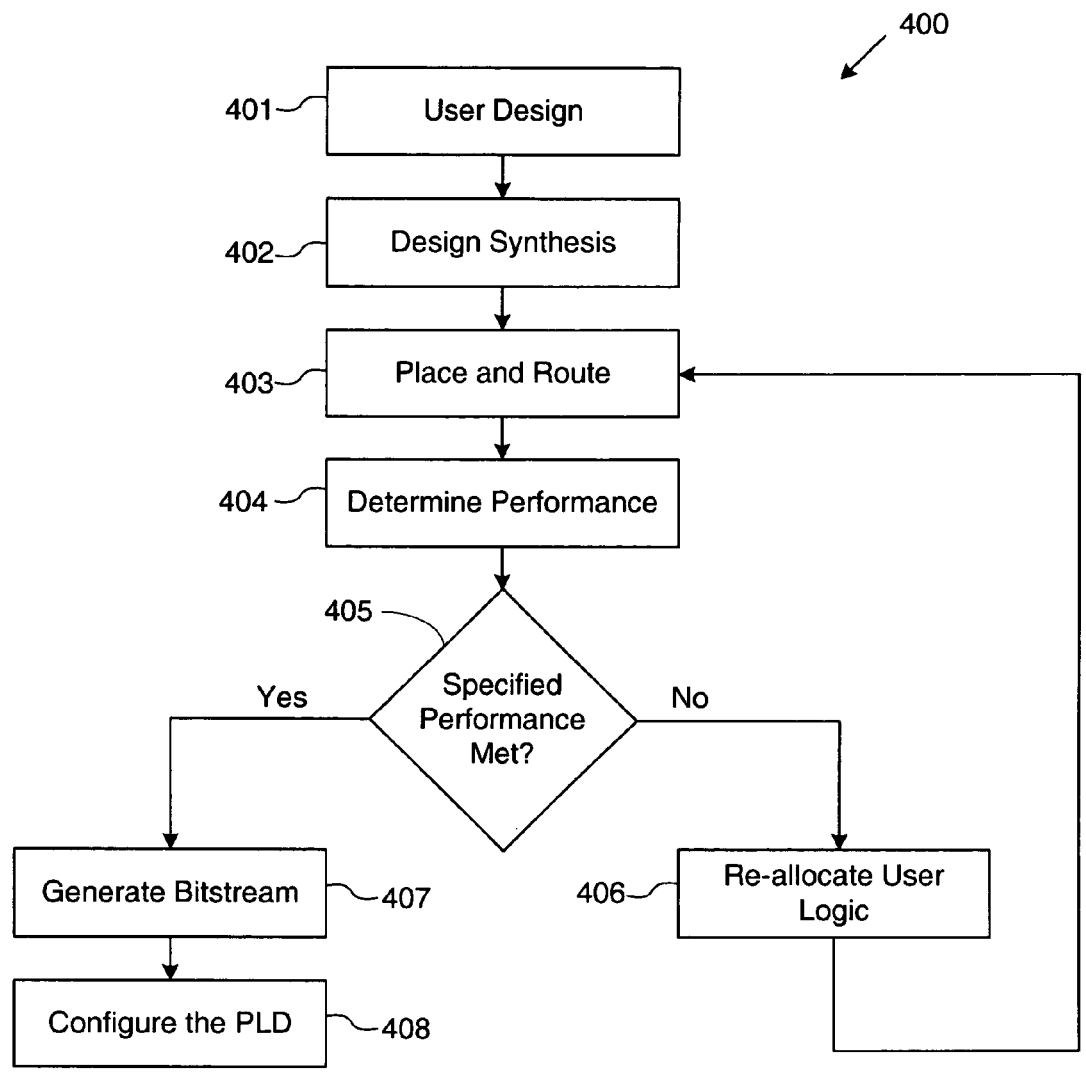
FIG. 4 is a flow diagram illustrating an exemplary design flow for configuring some embodiments of the present invention.

FIG. 4 is a flow diagram 400 illustrating an exemplary design flow that may be used for implementing a user design in PLD 300 in accordance with some embodiments of the present invention. Initially, a user designs a circuit to be implemented by the PLD 300 (Step 401). This user design may be described in a high-level specification, such as Verilog or VHDL. The high-level specification is first synthesized to basic logic cells (e.g., CLBs 102 and switch blocks 211) available on the PLD (Step 402). A well-known place and route process then assigns every logic cell and wire in the design to some physical resource in the PLD (Step 403). More specifically, a netlist embodying the user design may be analyzed for low-performance signals (e.g., non-critical timing paths) and for high-performance signals (e.g., critical timing paths). The nets associated with the low-performance signals may be identified and grouped together to form a first sub-netlist, and the nets associated with the high-performance signals may be identified and grouped together to form a second sub-netlist. Then, the logic associated with the first sub-netlist is allocated by the placer to the resources of the power-optimized first partition 310a, and the logic associated with the second sub-netlist is allocated by the placer to the resources of the performance-optimized second partition 310b. To minimize power consumption, the amount of user logic allocated to the resources in the power-optimized first partition 310a is maximized. Conversely, to maximize performance, the amount of user logic allocated to the resources in the performance-optimized second partition 310b may be maximized.

Next, a well-known simulation operation is used to determine the performance of the user design as implemented in PLD 300 by the place and route process (Step 404). For example, a simulation tool may be used to ascertain whether all critical timing paths of the user design fall within the specified performance parameters and/or to determine the total power consumption of the user design as will be implemented in the PLD. If the specified performance parameters are not met, as tested in Step 405, then some of the logic embodied by the user design is re-allocated from the resources of the power-optimized first partition 310a to the resources of performance-optimized second partition 310b (Step 406), and the place and route process is repeated according to the re-allocation of logic performed in step 406 (Step 403). Conversely, if the specified performance parameters are met, as tested in Step 405, the design is converted into a configuration bitstream in a well-known manner (Step 407). The configuration bitstream is then used to configure the PLD by setting various on-chip configuration memory cells to desired states that cause the PLD's resources to implement the user design embodied by the configuration data (Step 408).

For other embodiments, the non-critical timing portions of the user design may be allocated to the power-optimized first partition 310a and the critical timing portions of the user design may be allocated to the performance-optimized second partition 310b.

Figure 5:
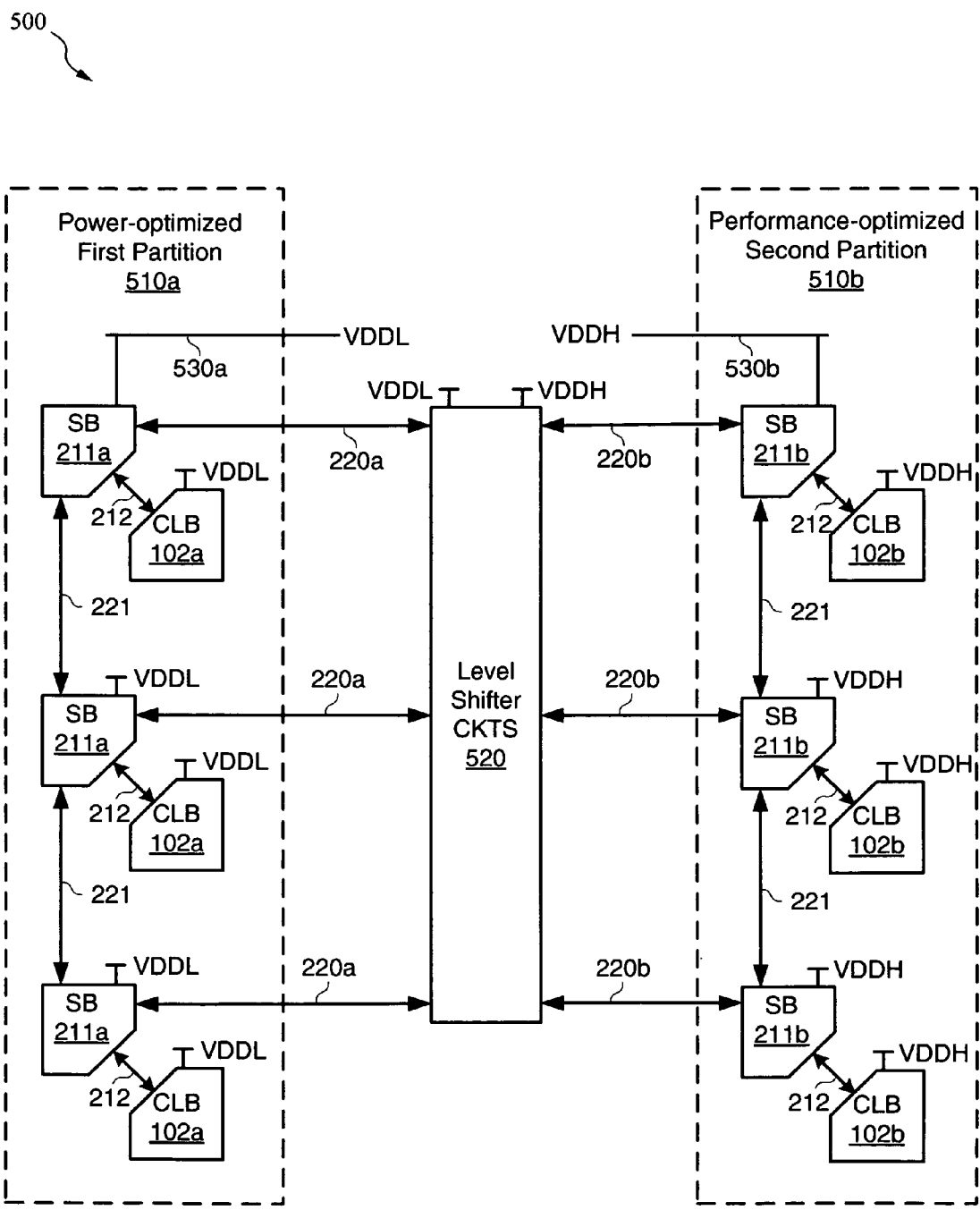
FIG. 5 is a simplified block diagram of a PLD having a low-voltage partition and a high-voltage partition in accordance with first embodiments of the PLD of FIG. 3.

For first embodiments of PLD 300, the resources (e.g., CLBs 102a and switch blocks 211a) of the first partition 310a are powered by a relatively low supply voltage to minimize power consumption therein, and the resources (e.g., CLBs 102b and switch blocks 211b) of the second partition 310b are powered by a relatively high supply voltage to maximize performance thereof. For example, FIG. 5 shows a PLD 500 that is an exemplary first embodiment of PLD 300 of FIG. 3. PLD 500 includes a power-optimized first partition 510a, a performance-optimized second partition 510b, a bank of level-shifter circuits 520, a first power rail 530a, and a second power rail 530b. The first power rail 530a provides a relatively low supply voltage (VDDL) to the power terminals of the CLBs 102a and switch blocks 211a of the power-optimized first partition 510a, which is one embodiment of the power-optimized partition 310a of FIG. 3. The second power rail 530b provides a relatively high supply voltage (VDDH) to the power terminals of the CLBs 102b and switch blocks 211b of the performance-optimized second partition 510b, which is one embodiment of the performance-optimized partition 310b of FIG. 3. Although not shown in FIG. 5 for simplicity, each of CLBs 102a-102b and switch blocks 211a-211b may also include a power connection to ground potential. Further, although not shown for simplicity, for other embodiments, the first and second partitions 510a and 510b may include other resources, for example, block RAM, IOBs, embedded processors, and so on.

For the first embodiments described herein with respect to FIG. 5, the transistors that implement the CLBs 102a and switch blocks 211a of the power-optimized partition 510a may be fabricated in an identical manner as the transistors that implement the CLBs 102b and switch blocks 211b, respectively, of the performance-optimized partition 510b. Thus, for example, for such first embodiments, the transistors that form the LUTs, multiplexers, flip-flops, and other resources of the first partition 510a may be fabricated to have similar device ratios, dopant concentrations, threshold voltages, and gate oxide thicknesses as the transistors that form the LUTs, multiplexers, flip-flops, and other resources of the second partition 510b. Further, in accordance with the first embodiments, VDDL is set to a relatively low voltage that minimizes the power consumption of the resources of the first partition 510a while satisfying the non-critical timing paths of the user design, and VDDH is set to a relatively high voltage that maximizes performance of the resources of the second partition 510b to satisfy the critical timing paths of the user design. For exemplary embodiments described herein, VDDH has a value of approximately 1.2 volts, and VDDL has a value of approximately 0.8 volts, although for other embodiments VDDL and VDDH may have other suitable values. Further, VDDL and VDDH may be generated in any suitable manner. For example, for some embodiments, PLD 500 may include separate, well-known voltage supply circuits (not shown for simplicity) to generate VDDL and VDDH. For other embodiments, PLD 500 may include one voltage supply circuit (not shown for simplicity) to generate VDDH, and a well-known voltage regulator (not shown for simplicity) to generate VDDL from VDDH. For still other embodiments, VDDL and VDDH may be generated off-chip.

Level-shifter circuits 520, which include a plurality of first ports coupled to switch blocks 211a of power-optimized partition 510a via signal lines 220a and a plurality of second ports coupled to switch blocks 211b of performance-optimized partition 510b via signal lines 220b, are configured to translate logic signals between the low-voltage VDDL domain of power-optimized PLD partition 510a and the high-voltage VDDH domain of performance-optimized PLD partition 510b. For simplicity, level-shifter circuits 520 and signal lines 220a-220b are represented collectively in FIG. 5. For some embodiments, level-shifter circuits 520 are configured to convert low-voltage output signals received from first partition 510a via signal lines 220a into high-voltage input signals provided to second partition 510b via signal lines 220b, and are configured to pass the high-voltage output signals received from second partition 510b via signal lines 220b to first partition 510a via signal lines 220a.

Figure 6:
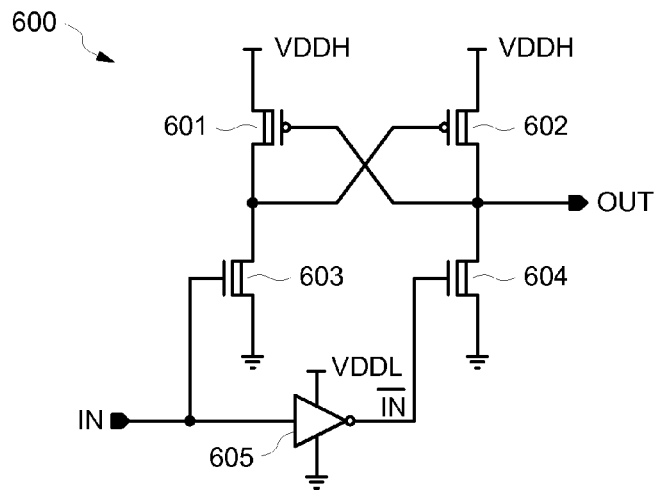
FIG. 6 is a circuit diagram of a conventional level-shifter circuit.

For example, FIG. 6 shows a well-known level-shifter 600 that may be employed within some embodiments of level-shifter circuits 520 of FIG. 5. Level-shifter 600 includes PMOS transistors 601-602, NMOS transistors 603-604, and an inverter 605. Transistor pairs 601/603 and 602/604 are connected in series between VDDH and ground potential, and inverter 605 is a well-known CMOS inverter having power terminals coupled to VDDL and to ground potential. For some embodiments, transistors 601-604 may be high-voltage transistors having thick gate oxides that allow transistors 601-604 to tolerate the high voltages of VDDH, while the transistors that form inverter 605 may be low-voltage transistors having thin gate oxides that allow inverter 605 to have a low threshold voltage. For other embodiments, all transistors in circuit 600 may be low-voltage transistors. Level-shifter 600 translates a low voltage input signal IN into a high voltage output signal OUT as follows. When IN is logic low (e.g., IN=0 volts), inverter 605 pulls the gate of NMOS transistor 604 high to VDDL. In response thereto, transistor 604 turns on and pulls OUT low to ground potential (e.g., OUT=0 volts). Conversely, when IN is logic high (e.g., IN=VDDL), NMOS transistor 603 turns on and pulls the gate of PMOS transistor 602 low to ground potential. In response thereto, PMOS transistor 602 turns on and pulls OUT high to VDDH (e.g., OUT=VDDH). In this manner, level-shifter 600 can translate a low voltage signal IN having a voltage swing between 0 volts and VDDL into a high voltage signal OUT having a voltage swing between 0 volts and VDDH.

For other embodiments, level-shifter circuits 520 may also be configured to convert high-voltage output signals received from second partition 510b via signal lines 220b into low-voltage input signals provided to first partition 510a via signal lines 220a.

For some embodiments of FIG. 5, the power terminals of the resources of the first partition 510a are hardwired to VDDL via the first power rail 530a, and the power terminals of the resources of second partition 510b are hardwired to VDDH via the second power rail 530b, and therefore include a fixed number of power-optimized resources and a fixed number of performance-optimized resources. For other embodiments, allocation of PLD 500's resources as either power-optimized or performance-optimized may be dynamically controlled by dividing the resources into a plurality of partitions that may be independently configured to operate at either VDDL or VDDH.

Figure 7A:
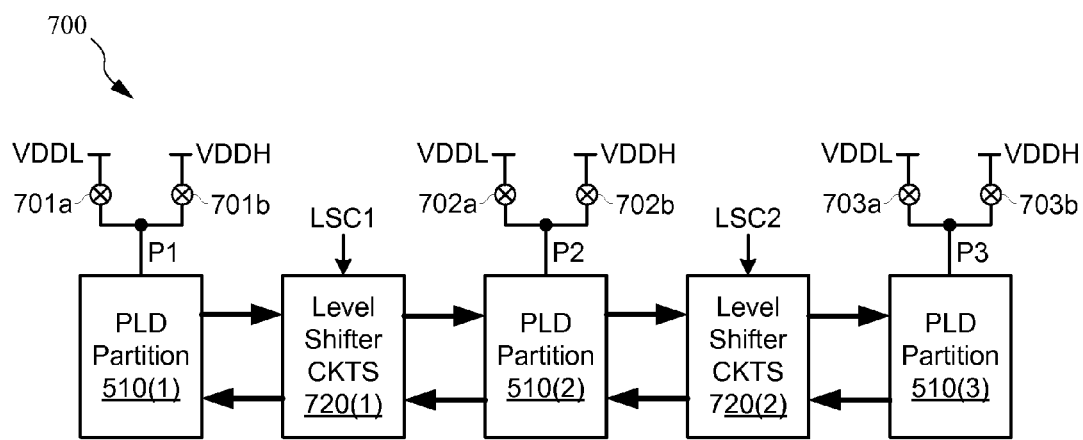
FIG. 7A is a simplified block diagram depicting one implementation of the PLD of FIG. 5.

For one example, FIG. 7A shows an exemplary PLD 700 having three PLD partitions 510(1)-510(3) interleaved with two banks of level-shifter circuits 720(1)-720(2), where each of the PLD partitions 510(1)-510(3), which are similar in architecture to partitions 510 of FIG. 5, may be selectively configured to operate at either VDDL or VDDH by controlling the states of fuse pairs 701-703, respectively. For simplicity, PLD 700 is shown to include only three partitions 510(1)-510(3). For actual embodiments, PLD 700 may include a greater number of interleaved partitions 510 and level-shifter circuits 720. As shown in FIG. 7A, first partition 510(1) includes a power terminal P1 that may be selectively connected to VDDL via fuse 701*a* and selectively connected to VDDH via fuse 701*b*, second partition 510(2) includes a power terminal P2 that may be selectively connected to VDDL via fuse 702*a* and selectively connected to VDDH via fuse 702*b*, and third partition 510(3) includes a power terminal P3 that may be selectively connected to VDDL via fuse 703*a* and selectively connected to VDDH via fuse 703*b*. In this manner, partitions 510(1)-510(3) may be configured as power-optimized partitions by blowing fuses 701*b*-703*b*, respectively, and leaving intact fuses 701*a*-703*a*, respectively, and may be configured as performance-optimized partitions by blowing fuses 701*a*-703*a*, respectively, and leaving intact fuses 701*b*-703*b*, respectively. In this manner, the number of power-optimized partitions and the number of performance-optimized partitions may be selected (e.g., by the manufacturer) by blowing an appropriate one of each of fuse pairs 701-703 prior to packaging PLD 700.

Level-shifter circuits 720(1)-720(2), which for some embodiments may be implemented using well-known circuitry, selectively level shift signals between corresponding pairs of partitions 510 in response to level-shift control signals LSC1-LSC2, respectively. For example, level-shifter circuits 720(1) selectively level shift signals transmitted between first and second partitions 510(1)-510(2) in response to LSC1, and level-shifter circuits 720(2) selectively level shift signals transmitted between second and third partitions 510(2)-510(3) in response to LSC2. For some embodiments, LSC1-LSC2 may be hardwired to suitable logic states (e.g., to either a voltage supply or ground potential). For other embodiments, LSC1-LSC2 may be selectively coupled to either a logic "1" state (e.g., VDDL or VDDH) or to a logic "0" state (e.g., to ground potential) using fuse pairs (not shown for simplicity) in a manner similar to that of fuse pairs 701-703.

For example, to configure partition 510(1) as a power-optimized partition and to configure partitions 510(2)-510(3) as performance-optimized partitions, power terminal P1 may be connected to VDDL (e.g., by blowing fuse 701*b*), and power terminals P2 and P3 may be connected to VDDH (e.g., by blowing fuses 702*a* and 703*a*). Then, LSC1 may be set to a first state that configures level-shifter circuits 720(1) to level shift signals transmitted between the low-voltage partition 510(1) and the high-voltage partition 510(2), and LSC2 may be set to a second state that causes level-shifter circuits 720(2) to not level shift signals transmitted between the high-voltage partitions 510(2)-510(3).

Figure 7B:
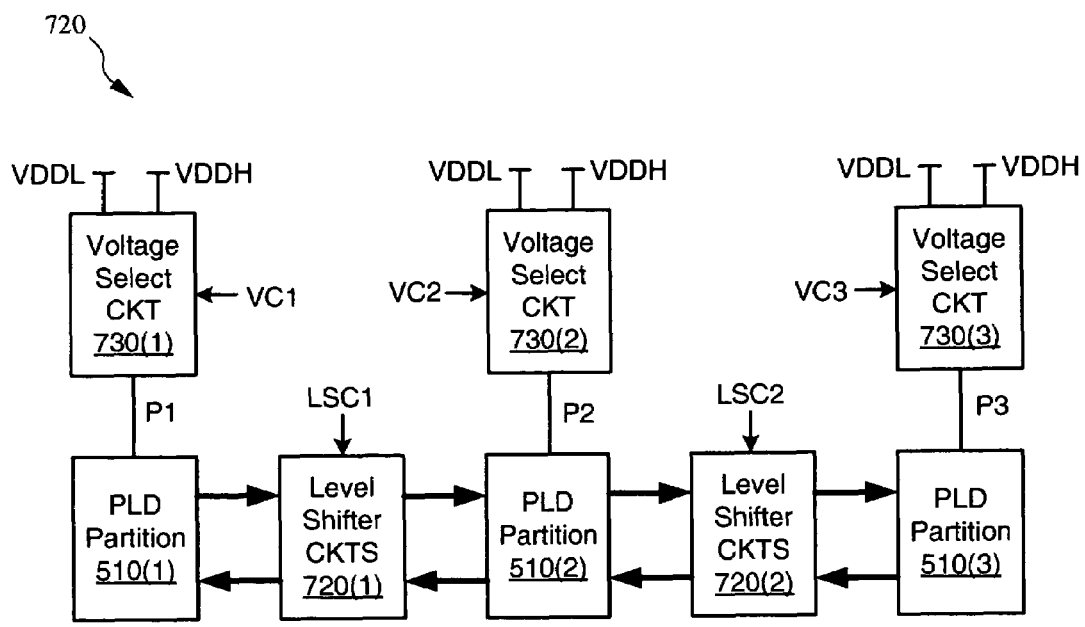
FIG. 7B is a simplified block diagram depicting another implementation of the PLD of FIG. 5.

For another example, FIG. 7B shows an exemplary PLD 720 having three PLD partitions 510(1)-510(3) interleaved with two banks of level-shifter circuits 720(1)-720(2), where each of the PLD partitions 510(1)-510(3) may be selectively configured to operate at either VDDL or VDDH by voltage select circuits 730(1)-730(3), respectively. For simplicity, PLD 720 is shown to include only three partitions 510(1)-510(3). For actual embodiments, PLD 720 may include a greater number of interleaved partitions 510 and level-shifter circuits 720. As shown in FIG. 7B, voltage select circuit 730(1) includes a first power terminal coupled to the power terminal P1 of first partition 510(1), a second power terminal coupled to VDDL, a third power terminal coupled to VDDH, and a control terminal to receive a first voltage control signal (VC1), voltage select circuit 730(2) includes a first power terminal coupled to the power terminal P2 of second partition 510(2), a second power terminal coupled to VDDL, a third power terminal coupled to VDDH, and a control terminal to receive a second voltage control signal (VC2), and voltage select circuit 730(3) includes a first power terminal coupled to the power terminal P3 of third partition 510(3), a second power terminal coupled to VDDL, a third power terminal coupled to VDDH, and a control terminal to receive a third voltage control signal (VC3).

Voltage select circuits 730(1)-730(3), which may implemented using well-known circuits, are configured to selectively couple power terminals P1-P3 of corresponding partitions 510(1)-510(3) to either VDDL or VDDH in response to VC1-VC3, respectively. For example, if VC1 is set to a first state, voltage select circuit 730(1) couples P1 to VDDL and thereby configures first partition 510(1) as a power-optimized partition having a low-voltage domain, and conversely, if VC1 is set to a second state, voltage select circuit 730(1) couples P1 to VDDH and thereby configures first partition 510(1) as a performance-optimized partition having a high-voltage domain. In this manner, PLD partitions 510(1)-510(3) may be dynamically configured (e.g., by a user) for low power consumption or for high speed by controlling the states of VC1-VC3, respectively.

VC1-VC3 may be generated in any suitable manner. For some embodiments, VC1-VC3 may be stored in suitable memory cells (not shown for simplicity). For other embodiments, VC1-VC3 may be generated externally (e.g., by a user) and provided to the PLD via suitable input pins (not shown for simplicity). For still other embodiments, VC1-VC3 my be generated dynamically by a power management unit (not shown for simplicity), for example, based upon the performance requirements of a circuit block. Alternatively, both VDDL and VDDH may be disabled, or VDDL may be selected in a low-power mode. Similarly, for embodiments of FIG. 7B, LSC1-LSC2 may be stored in suitable memory cells (not shown for simplicity), or alternatively may be generated externally (e.g., by a user) and provided to the PLD via its input pins (not shown for simplicity).

For first embodiments of FIGS. 7A and 7B in which all low-voltage partitions 510 are positioned to the left of a selected bank of level-shifter circuits 720 and all high-voltage partitions 510 are positioned to the right of the selected bank of level-shifter circuits 720, the selected bank of level-shifter circuits 720 may be configured to translate low-voltage signals output from the partition to the left into high-voltage signals for input to the partition to the right, and the other banks of level-shifter circuits 720 may be configured to pass (e.g., without level-shifting) signals between corresponding adjacent partitions that have the same voltage domain.

Figure 8A:
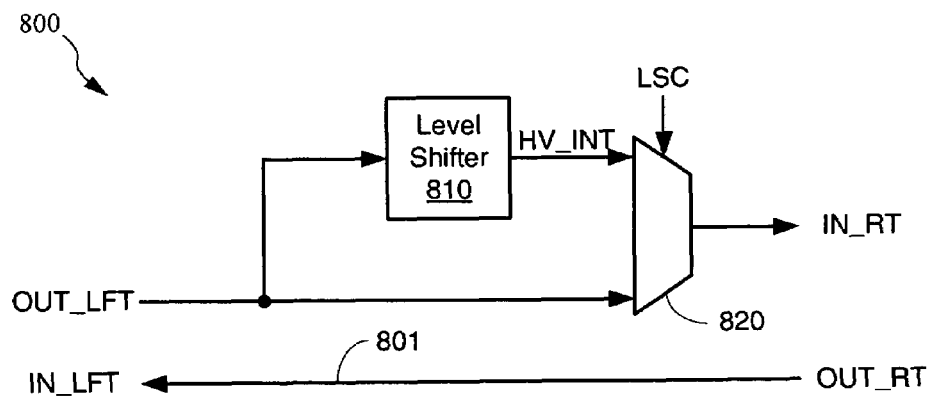
FIG. 8A is a simplified functional diagram of one embodiment of the level-shifter circuit of the PLD of FIG. 5.

For example, FIG. 8A shows a level-shifter circuit 800 that may be used to form level-shifter circuits 720 for the first embodiments of FIGS. 7A and 7B. Circuit 800 is shown to include a level-shifter 810 and a multiplexer (MUX) 820. Level-shifter 810, which has an input to receive an output signal (OUT_LFT) from a partition 510 positioned immediately to the left of circuit 800 and has an output coupled to a first input of MUX 820, is configured to translate OUT_LFT from a low-voltage signal to a high voltage intermediate signal (HV_INT). Level-shifter 810, which is well-known, also includes power terminals (not shown for simplicity) coupled to VDDL and to VDDH. For some embodiments, level-shifter 810 is similar to level-shifter 600 of FIG. 6. MUX 820, which is well-known, includes a first input to receive HV_INT, a second input to receive OUT_LFT, an output to provide an input signal (IN_RT) to the partition 510 positioned immediately to the right of circuit 800, and a control terminal to receive LSC. Circuit 800 also includes a signal line 801 that passes an output signal (OUT_RT) from the partition to the right of circuit 800 as an input signal (IN_LFT) to the partition to the left of circuit 800.

In operation, if the partition 510 to the left of circuit 800 is configured as a low-voltage domain and the partition 510 to the right of circuit 800 is configured as a high-voltage domain, LSC is set to the first state so that MUX 820 provides HV_INT as IN_RT, thereby level-shifting the low-voltage output signal (OUT_LFT) from the partition to the left to generate a high-voltage input signal (IN_RT) for the partition to the right. Conversely, if the partition 510 to the left of circuit 800 and the partition 510 to the right of circuit 800 are configured to have the same voltage domain, LSC is set to the second state so that MUX 820 passes OUT_LFT as IN_RT, thereby not level-shifting signals passed from the partition on the left to the partition on the right.

Figure 8B:
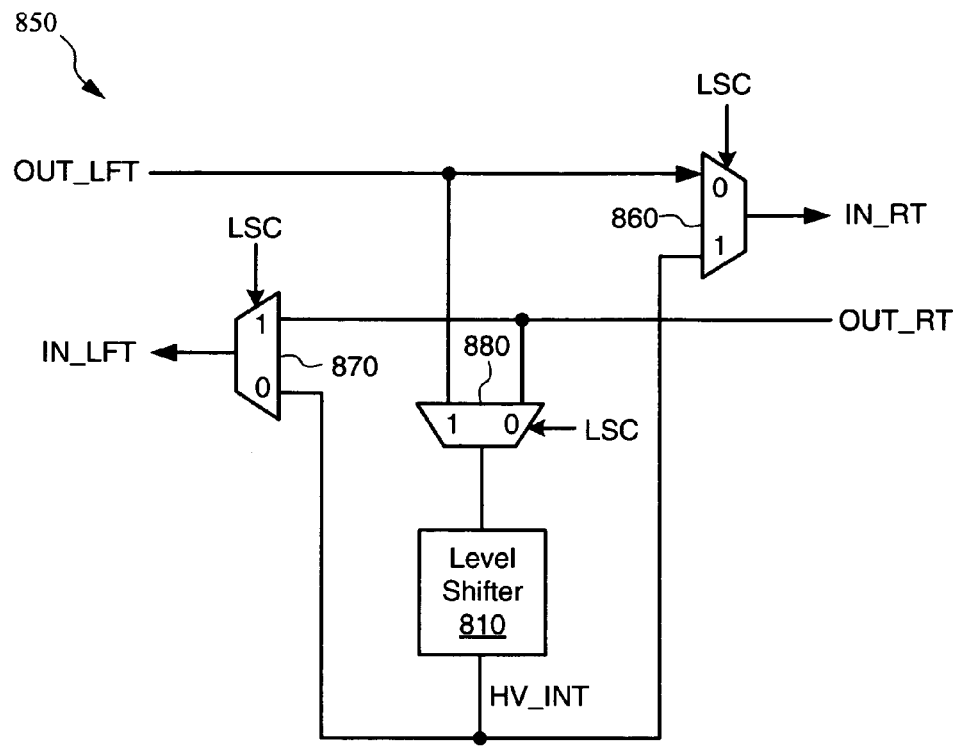
FIG. 8B is a simplified functional diagram of another embodiment of the level-shifter circuit of the PLD of FIG. 5.

For second embodiments of FIGS. 7A and 7B in which the low-voltage partitions and the high-voltage partitions are interposed between each other, each bank of level-shifter circuits 720 may be selectively configured to either pass signals between adjacent partitions, to translate low-voltage output signals from the partition into the left of circuits 720 to high-voltage input signals for the partition on the right of circuits 720, or to translate low-voltage output signals from the partition on the right of circuits 720 into high-voltage input signals for the partition on the left of circuits 720. For example, FIG. 8B shows a level-shifter circuit 850 that may be used to form level-shifter circuits 720 for the second embodiments of FIGS. 6 and 7. Circuit 850 includes level-shifter 810 and three MUXes 860, 870, and 880. MUX 860 includes a first input to receive OUT_LFT, a second input coupled to the output of level-shifter 810, an output to provide IN_RT, and a control terminal to receive LSC. MUX 870 includes a first input coupled to the output of level-shifter 810, a second input to receive OUT_RT, an output to provide IN_LFT, and a control terminal to receive LSC. MUX 880 includes a first input to receive OUT_RT, a second input to receive OUT_LFT, an output coupled to the input of level-shifter 810, and a control terminal to receive LSC.

An exemplary operation of level-shifter circuit 850 is as follows. If the partition 510 to the left of circuit 850 is configured as a low-voltage domain and the partition 510 to the right of circuit 850 is configured as a high-voltage domain, then LSC may be set to a logic "1" state that causes circuit 850 to translate low-voltage output signals (e.g., OUT_LFT) from the partition on the left into high-voltage input signals (e.g., IN_RT) for the partition on the right. More specifically, in response to the logic "1" state of LSC, MUX 880 forwards OUT_LFT to level-shifter 810, which translates OUT_LFT from a low-voltage signal into the high-voltage intermediate signal (HV_INT). The logic "1" state of LSC causes MUX 860 to forward HV_INT as IN_RT, and also causes MUX 870 to forward OUT_RT as IN_LFT. Conversely, if partition 510 to the left of circuit 850 is configured as a high-voltage domain and the partition 510 to the right of circuit 850 is configured as a low-voltage domain, then LSC may be set to a logic "0" state that causes circuit 850 to translate low-voltage signals output (e.g., OUT_RT) from the partition on the right into high-voltage input signals (e.g., IN_LFT) for the partition on the left. More specifically, in response to the logic "0" state of LSC, MUX 880 forwards OUT_RT to level-shifter 810, which translates OUT_RT from a low-voltage signal to the high-voltage intermediate signal (HV_INT). The logic "0" state of LSC causes MUX 870 to forward HV_INT as IN_LFT, and also causes MUX 860 to forward OUT_LFT as IN_RT.

Figure 9:
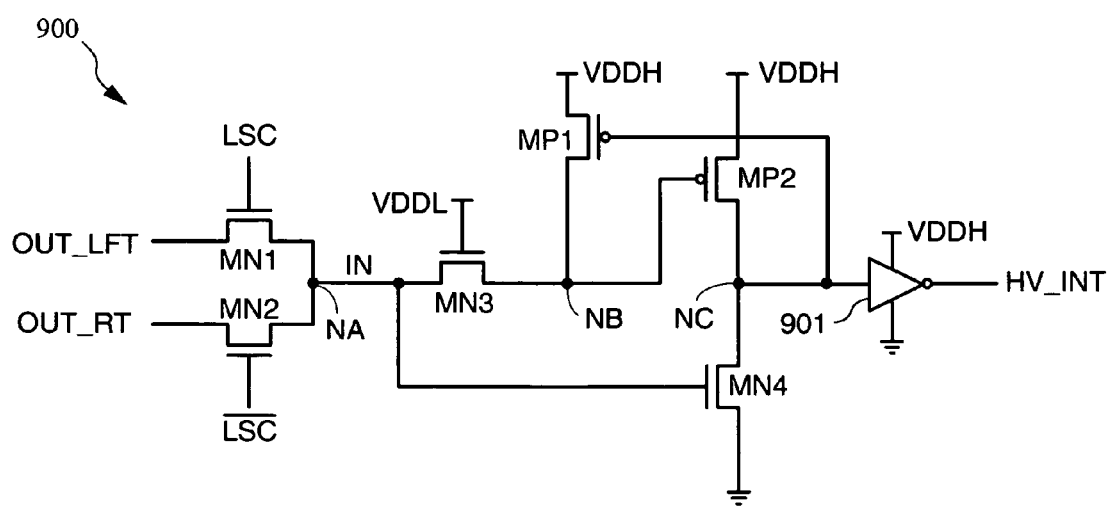
FIG. 9 is a circuit diagram of a level-shifter circuit in accordance with another embodiment of the present invention.

Referring again to FIG. 8B, the functions of level-shifter 810 and MUX 880 may be combined to reduce circuit overhead, for example, as depicted by the implementation of circuit 900 of FIG. 9. Circuit 900 includes NMOS transistors MN1-MN4, PMOS transistors MP1-MP2, and an inverter 901. NMOS transistor MN1 is coupled between signal OUT_LFT and node NA, and has a gate to receive LSC. NMOS transistor MN2 is coupled between signal OUT_RT and node NA, and has a gate to receive the complement of LSC ($\overline{LSC}$). NMOS transistor MN3 is coupled between nodes NA and NB, and has a gate coupled to VDDL. PMOS transistor MP1 is coupled between VDDH and node NB, and has a gate coupled to node NC. PMOS transistor MP2 is coupled between VDDH and node NC, and has a gate coupled to node NB. NMOS transistor MN4 is coupled between node NC and ground potential, and has a gate coupled to node NA. Inverter 901, which includes power terminals coupled to VDDH and to ground potential, has an input coupled to node NC and an output to provide HV_INT.

NMOS transistors MN1-MN2 perform the multiplexing function, where the logic state of LSC selects whether OUT_LFT or OUT_RT is provided as an input signal (IN) to node NA. For example, if LSC=1 and $\overline{LSC}$=0, which turns on transistor MN1 and turns off transistor MN2, respectively, then OUT_LFT is provided as IN at node NA. Conversely, if LSC=0 and $\overline{LSC}$=1, which turns off transistor MN1 and turns on transistor MN2, respectively, then OUT_RT is provided as IN at node NA. NMOS transistors MN3-MN4, PMOS transistors MP1-MP2, and inverter 901 perform the level shifting function. For example, if IN is logic low (e.g., IN=0 volts), NMOS transistor MN4 turns off to isolate node NC from ground potential, and transistor MN3 pulls node NB low to ground potential. The resultant logic low state at node NB turns on PMOS transistor MP2, which pulls node NC high towards VDDH. The logic high state at node NC turns off PMOS transistor MP1 to isolate node NB from VDDH. Inverter 901 inverts the logic high state at node NC to drive HV_INT to a logic low state (e.g., HV_INT=0 volts). Conversely, if IN is logic high (e.g., IN=VDDL), NMOS transistor MN4 turns on and pulls node NC to ground potential, and transistor MN3 drives node NB to approximately VDDL−VT. The resulting logic high state at node NB turns off PMOS transistor MP2, which isolates node NC from VDDH. The resultant logic low state at node NC turns on PMOS transistor MP1, which acts as a keeper circuit to pull node NB to approximately VDDH. Inverter 901 inverts the logic low state at node NC to drive HV_INT to a logic high state (e.g., HV_INT=VDDH). In this manner, circuit 900 converts an input signal IN having a voltage swing between approximately 0 volts and VDDL to an output signal HV_INT having a voltage swing between approximately 0 volts and VDDH using less circuitry than a conventional multiplexer and the conventional level-shifter 900 of FIG. 9.

As described above with respect to FIG. 5, level-shifter circuits 520 translate low-voltage signals (e.g., having a voltage swing between approximately 0 volts and VDDL) output from the low-voltage domain of first partition 510a into high-voltage signals (e.g., having a voltage swing between approximately 0 volts and VDDH) for input to the high-voltage domain of second partition 510b, for example, as described in the exemplary level-shifting embodiment of FIG. 6. In this manner, the switch blocks 211a in the low-voltage domain 510a do not directly drive signals into the switch blocks 211b in the high-voltage domain 510b, which as described below could result in undesirable short-circuit current paths.

Figure 10:
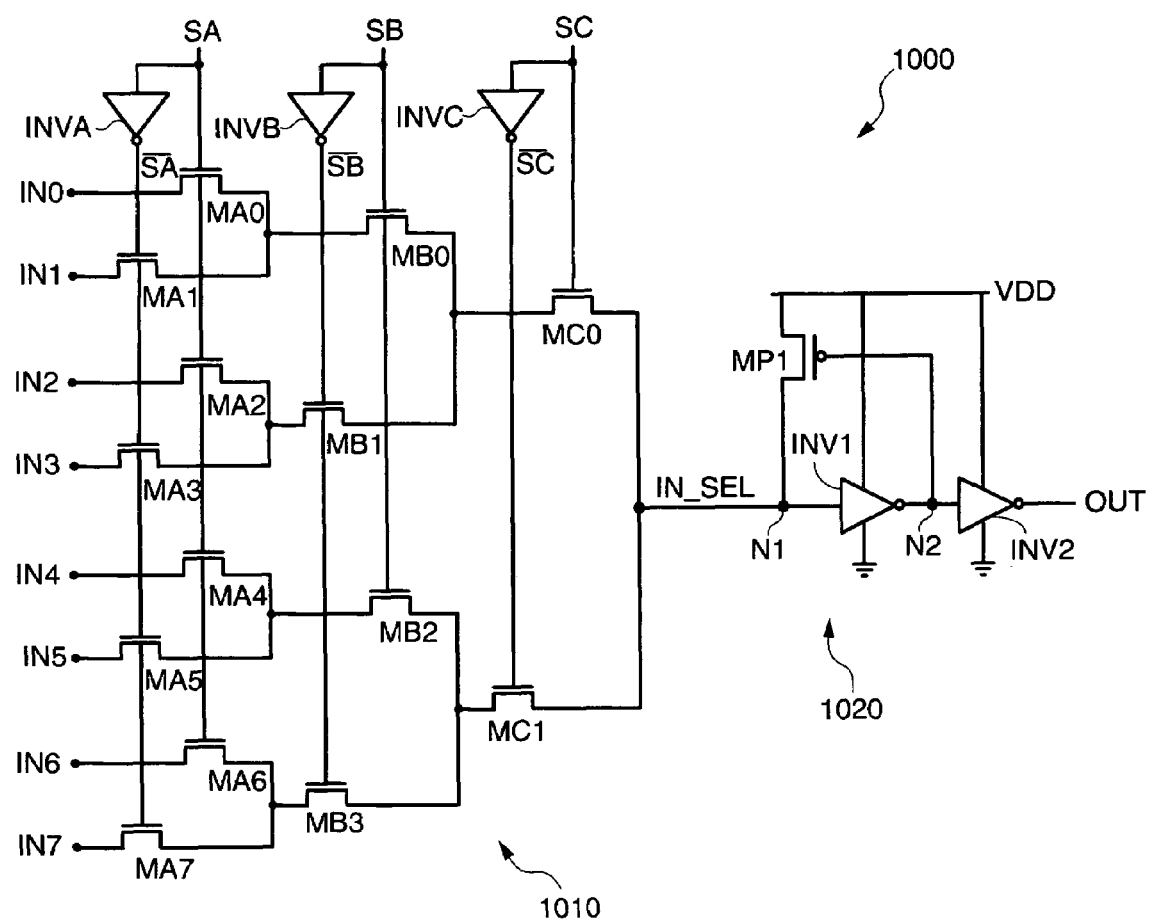
FIG. 10 is a circuit diagram of a portion of a switch block that may be employed in the PLDs of the present invention.

More specifically, referring to FIG. 10, a conventional multiplexer (MUX) circuit 1000 is configured to select one of eight input signals IN0-IN7 to provide as an output signal OUT in response to three select signals SA-SC. As known in the art, MUX circuit 1000 may be used to implement routing functions in switch blocks 211, and may also be used to implement other logic elements including, for example, a look-up table (LUT) that implements the function generators (not shown for simplicity) in the FPGA device's CLBs. For purposes of discussion herein, circuit 1000 is used to implement the switch blocks 211a of the first partition 510a and the switch blocks 211b of the second partition 510b, and the select signals SA-SC, which are stored in configuration memory cells (not shown for simplicity) powered by a regulated voltage (Vgg), have a logic "0" value equal to approximately 0 volts and have a logic "1" value equal to approximately Vgg, where Vgg is between 1.3 and 1.4 volts. Thus, for the examples described herein, Vgg>VDDH>VDDL.

Circuit 1000 is shown to include a multiplexer portion 1010 and a keeper circuit 1020. The multiplexer portion 1010 includes three hierarchical levels of 2:1 MUXes formed by pairs of NMOS transistors in a well-known manner. More specifically, the first-level MUXes formed by transistor pairs MA0-MA1, MA2-MA3, MA4-MA5, and MA6-MA7 receive input signal pairs IN0-IN1, IN2-IN3, IN4-IN5, and IN6-IN7, respectively, where transistors MA0, MA2, MA4, and MA6 have gates responsive to SA, and transistors MA1, MA3, MA5, and MA7 have gates responsive to $\overline{SA}$, which is the logical complement of SA provided by inverter INVA. The second-level MUXes formed by transistor pairs MB0-MB1 and MB2-MB3 receive input signals from corresponding pairs of the first-level MUXes, where transistors MB0 and MB2 have gates responsive to SB, and transistors MB1 and MB3 have gates responsive to $\overline{SB}$, which is the logical complement of SB provided by inverter INVB. The third-level MUX formed by transistor pair MC0-MC1 receives input signals from corresponding pairs of the second-level MUXes, where transistor MC0 has a gate responsive to SC, and transistor MC1 has gate responsive to $\overline{SC}$, which is the logical complement of SC provided by inverter INVC, forwards one of the selected input signal as IN_SEL to node N1.

The keeper circuit 1020 includes CMOS inverters INV1-INV2, and a PMOS pull-up transistor MP1. Inverter INV1 is coupled between nodes N1 and N2, and has power terminals coupled to ground potential and to VDD. Inverter INV2 is coupled between node N2 and the circuit's output (OUT), and has power terminals coupled to ground potential and to VDD. Although not shown for simplicity, each inverter INV1 and INV2 is formed in a well-known manner by a PMOS and an NMOS transistor pair coupled in series between VDD and ground potential. PMOS transistor MP1 is coupled between VDD and node N1, and has a gate coupled to node N2.

Keeper circuit 1020 restores the voltage of a logic high input signal after propagating through multiplexer portion 1010. For example, if input signal IN0 is logic "1" (e.g., IN0=VDD) and if SA-SC are driven to logic "1," (e.g., SA=SB=SC=Vgg) to turn on NMOS pass gates MA0, MB0, and MC0, signal IN0 experiences a threshold voltage drop VT across transistors MA0, MB0, and MC0 such that the voltage of the resultant signal IN_SEL at node N1 is approximately Vgg-VT_PG, where VT_PG is the total voltage drop across selected pass gates MA0, MB0, and MC0. As long as the voltage of IN_N1 is sufficient to turn off the PMOS pull-up transistor and turn on the NMOS pull-down transistor in inverter INV1, inverter INV1 pulls node N2 low toward ground potential, which in turn causes transistor MP1 to turn on and pull node N1 to VDD, thereby restoring the logic "1" voltage of IN_N1 to VDD.

When circuit 1000 implements input routing functions in a switch block 211b of the second partition 510b of PLD 500 of FIG. 5, VDD=VDDH. If PLD 500 did not include level-shifter circuits 520, the input signals IN0-IN7 to circuit 1000 in the second partition 510b would be driven directly by the output inverter INV2 of a similar circuit 1000 that implements output routing functions in a corresponding switch block 211a of the first partition 510a, and therefore input signals IN0-IN7 would have logic "1" values equal to approximately VDDL. Thus, as a selected logic "1" input signal IN received from first partition 211a passes through multiplexer portion 1010 of circuit 1000, the voltage of the resultant signal IN_SEL at node N1 may be insufficient to completely turn off the PMOS pull-up transistor (not shown for simplicity) within inverter INV1 (which is powered by VDDH), which in turn may result in a short-circuit current path between VDDH and ground potential through inverter INV1. Thus, by including level-shifter circuits 520 between the low-voltage first partition 510a and the high-voltage second partition 510b, signals received from the first partition 510a are level shifted by circuits 520 so that the input signals IN0-IN7 to circuit 1000 in the second partition 510b have logic "1," voltages of approximately VDDH, thereby preventing the above-described short-circuit current path in inverter INV1.

As described above with respect to FIG. 5, the level-shifter circuits 520 only translate low-voltage signals to high-voltage signals; the high-voltage signals output from the switch blocks 211b of second partition 510b are passed unaltered to the switch blocks 211a of first partition 510a, which may be acceptable for some applications. However, if a high-voltage signal output from a switch block 211b of second partition 510b is provided as an input signal IN to the circuit 1000 within a switch block 211a of first partition 510a, an undesirable leakage current from VDDH to VDDL may result, which in turn may not only degrade performance but may also result in unnecessary power dissipation.

Figure 11:
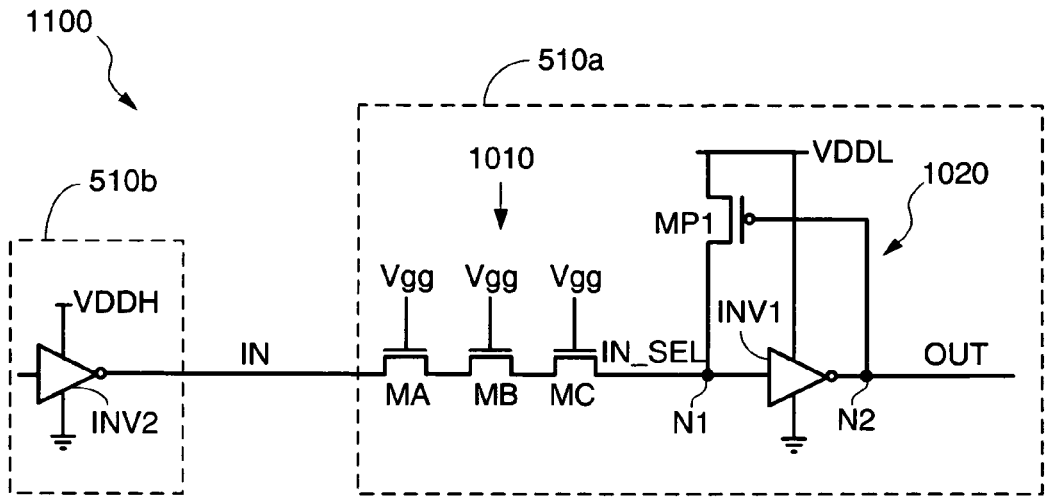
FIG. 11 is a simplified functional diagram depicting the switch block portion of FIG. 10 in a low-voltage partition of the PLD being driven by a signal from a high-voltage partition of the PLD.

For example, FIG. 11 shows a functional circuit diagram 1100 illustrating the propagation of a signal IN from the high-voltage output inverter INV2 of the circuit 1000 within a switch block 211b of the second partition 510b to the circuit 1000 within a switch block 211a of low-voltage first partition 510a, where inverter INV2 has power terminals coupled to ground potential and VDDH, inverter INV1 has power terminals coupled to ground potential and VDDL, and the selected pass gates MA-MC are driven by Vgg. In operation, output inverter INV2 of second partition 510b drives IN to a logic "1" state of VDDH. The resultant signal IN_SEL at node N1 has a logic "1" voltage (V_N1) that is the lesser of VDDH and Vgg-VT_PG, where VT_PG is the threshold voltage drop NMOS pass gates MA-MC. If V_N1 is greater than VDDL, then an undesirable current path from VDDH to VDDL through inverter INV2, pass gates MA-MC, and transistor MP1 occurs, which may result in undesirable power dissipation.

Figure 12A:
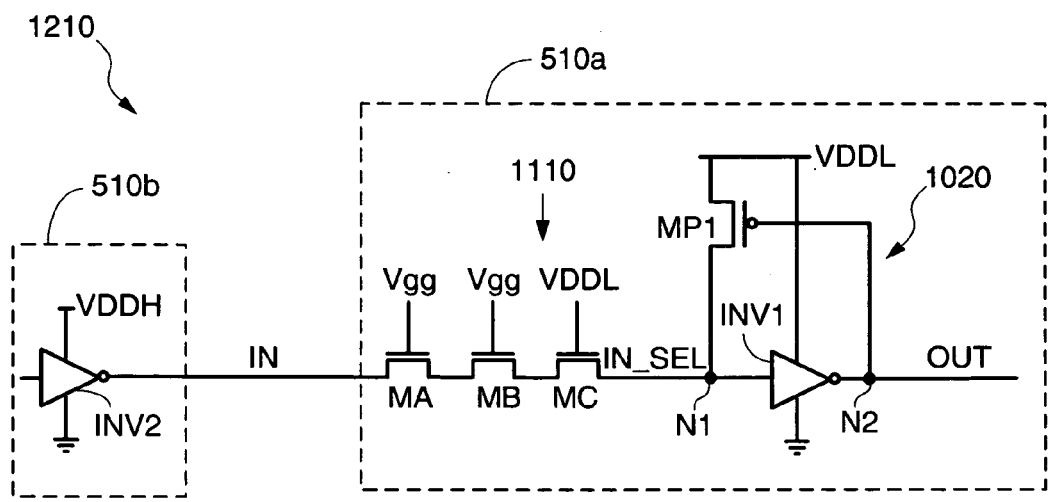
FIG. 12A is a simplified functional diagram of one embodiment of a switch block portion employed in the low-voltage partition of the PLD of FIG. 5.

For some embodiments, the aforementioned current path from VDDH to VDDL may be eliminated by driving the gate of NMOS pass gate MC with a logic "1" voltage of VDDL instead of Vgg, as depicted by the functional circuit diagram 1210 of FIG. 12A. In this manner, the voltage (V_N1) at node N1 is limited to VDDL-VT_PG. For example, after V_N1 reaches a voltage sufficient to drive the output of inverter INV1 to logic low and turn on transistor MP1, IN_SEL is pulled to VDDL. Because the gate voltage of NMOS pass gate MC is also at VDDL, the current path from VDDH to VDDL through pass gates MA-MC is prevented. However, driving pass gate MC with VDDL instead of Vgg may undesirably increase the gate delay through pass gate MC. To compensate for the reduced performance resulting from the lower gate voltage, pass gate MC may be fabricated as a low-voltage transistor (e.g., having a lower than normal VT), or may be biased with a small positive voltage (e.g., to reduce the VT of pass gate MC).

Figure 12B:
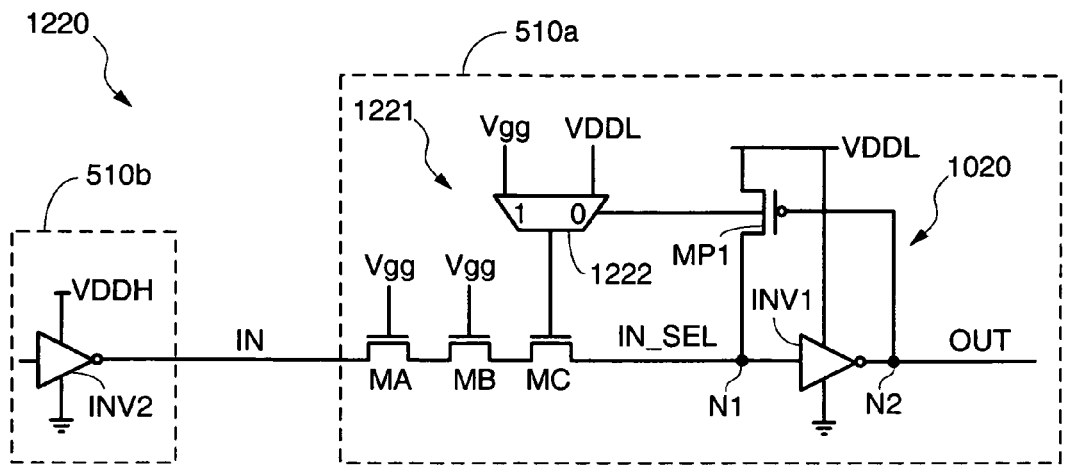
FIG. 12B is a simplified functional diagram of another embodiment of a switch block portion employed in the low-voltage partition of the PLD of FIG. 5.

For another embodiment, the aforementioned current path from VDDH to VDDL may be eliminated with minimum performance degradation by selectively driving the gate of NMOS pass gate MC with either Vgg or VDDL. For example, FIG. 12B shows a functional circuit diagram 1220 including a multiplexing portion 1221 coupled to keeper portion 1020. Multiplexing portion 1221, which may replace multiplexing portion 1010 of FIG. 10, includes pass gates MA-MC and a MUX 1222, where MUX 1222 has a first input driven by VDDL, a second input driven by Vgg, an output coupled to the gate of pass transistor MC, and a control terminal coupled to the output of inverter INV1. During low-to-high signal transitions of IN_SEL, IN_SEL is initially low (e.g., V_N1=0 volts) and the output of inverter INV1 is high (OUT=VDDL), which causes MUX 1222 to drive the gate of MC with Vgg, thereby minimizing the gate delay of pass transistor MC. When the voltage of IN_SEL reaches a logic high value sufficient to switch the output of inverter INV1 to logic low, PMOS transistor MP1 turns on and pulls node N1 to VDDL and MUX 1222 drives the gate of MC with VDDL, thereby eliminating the current path from VDDH to VDDL through pass gates MA-MC and PMOS transistor MP1.

Figure 13A:
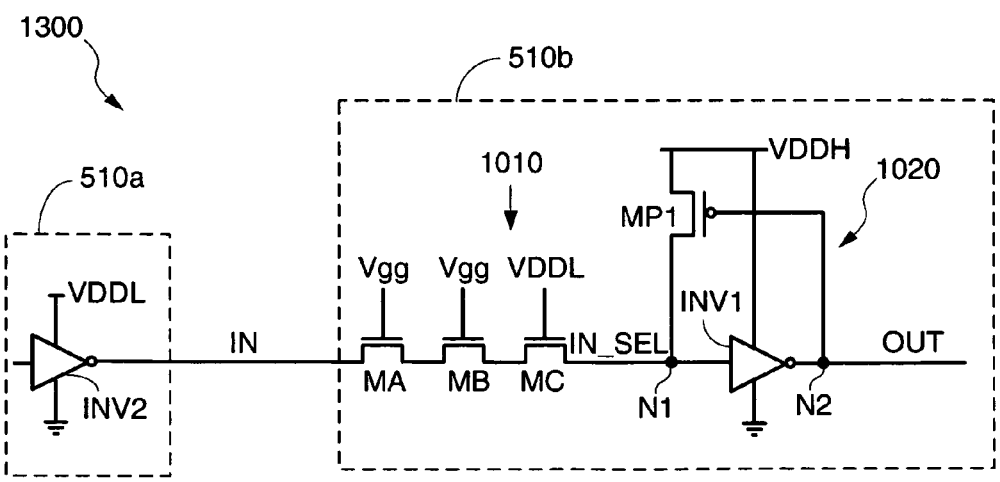
FIG. 13A is a simplified functional diagram of one embodiment of a switch block portion employed in the high-voltage partition of the PLD of FIG. 5.

Referring again to FIG. 5, for other embodiments, level-shifter circuits 520 may be eliminated, and the architecture and/or operation of routing circuit 1000 (see also FIG. 10) within the switch blocks 211b of the second partition 510b may be modified to level shift low-voltage signals to high-voltage signals. For example, FIG. 13A shows a functional circuit diagram 1300 illustrating the propagation of a signal IN from the low-voltage output inverter INV2 of the circuit 1000 within a switch block 211a of the first partition 510a to the circuit 1000 within a switch block 211b of high-voltage second partition 510b, where inverter INV2 has power terminals coupled to ground potential and VDDL, inverter INV1 has power terminals coupled to ground potential and VDDH, the selected pass gates MA-MB are driven by Vgg, and the selected pass gate MC is driven by VDDL. When output inverter INV2 of first partition 510a drives IN to a logic "1" state of VDDL, the resultant logic high voltage of signal IN_SEL at node N1 causes inverter INV1 to drive its output N2 low to ground potential, thereby turning on PMOS transistor MP1 and pulling node N1 higher towards VDDH. Because the gate of pass transistor MC is driven by VDDL, the voltage at node N1 is not passed through NMOS transistor MC, thereby preventing a short-circuit current path from VDDH to VDDL. In this manner, circuits 1010 and 1020 may level shift signal IN from a low-voltage signal to a high-voltage signal without requiring additional circuit components.

However, because the gate of NMOS pass transistor MC is driven by VDDL instead of Vgg, the voltage of signal IN_SEL at node N1 is initially equal to VDDL—VT_PG (i.e., before transistor MP1 turns on and pulls node N1 toward VDDH), which may be insufficient to trigger a high-to-low transition for inverter INV1. To prevent this undesirable condition, pass gate MC may be fabricated as a low-voltage transistor (e.g., having a lower than normal VT), or alternatively may be biased with a small positive voltage (e.g., to reduce the VT of pass gate MC). For other embodiments, VDDL may be used to drive the gate of pass transistor MA or pass transistor MB instead of the gate of pass transistor MC.

Figure 13B:
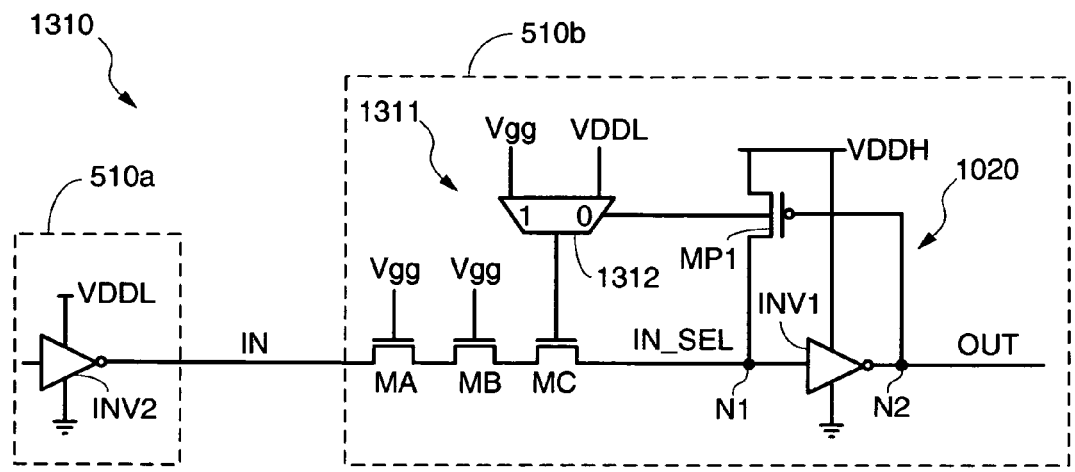
FIG. 13B is a simplified functional diagram of another embodiment of a switch block portion employed in the high-voltage partition of the PLD of FIG. 5.

For another embodiment, the aforementioned current path from VDDH to VDDL may be eliminated with minimum performance degradation by selectively driving the gate of NMOS pass gate MC with either Vgg or VDDL. For example, FIG. 13B shows a functional circuit diagram 1310 including a multiplexing portion 1311 coupled to keeper portion 1020. Multiplexing portion 1311, which may replace multiplexing portion 1010 of FIG. 10, includes pass gates MA-MC and a MUX 1312, where MUX 1312 has a first input driven by VDDL, a second input driven by Vgg, an output coupled to the gate of pass transistor MC, and a control terminal coupled to the output of inverter INV1. During low-to-high signal transitions of IN_SEL, IN_SEL is initially low (e.g., V_N1=0 volts) and the output of inverter INV1 is high (OUT=VDDH), which causes MUX 1312 to drive the gate of MC with Vgg, thereby minimizing the gate delay of pass transistor MC. When IN_SEL reaches a logic high value sufficient to switch the output of inverter INV1 to logic low, PMOS transistor MP1 turns on and pulls node N1 to VDDH (e.g., V_N1=VDDH) and MUX 1312 drives the gate of MC with VDDL, thereby eliminating the current path from VDDH to VDDL through pass gates MA-MC and PMOS transistor MP1. For other embodiments, the output of MUX 1312 may be coupled to the gate of pass transistor MA or pass transistor MB instead of the gate of pass transistor MC.

Referring again to FIG. 3, PLD 300 includes a first partition 310a that is optimized to consume minimum power and includes a second partition 310b that is optimized for maximum performance. As described above with respect to FIG. 5, for the first embodiments of PLD 300, the first partition is optimized for low-power consumption by powering its resources with a relatively low supply voltage VDDL, and the second partition is optimized for performance by powering its resources with a relatively high supply voltage VDDH. For second embodiments of PLD 300, the first partition 310a may be optimized for low-power consumption by implementing one or more of its resources using low-power transistors (e.g., transistors that exhibit relatively low power consumption), and the second partition 310b may be optimized for high-performance by implementing one or more of its resources using high-performance transistors (e.g., transistors that having relatively fast switching speeds and short gate delays).

Figure 14:
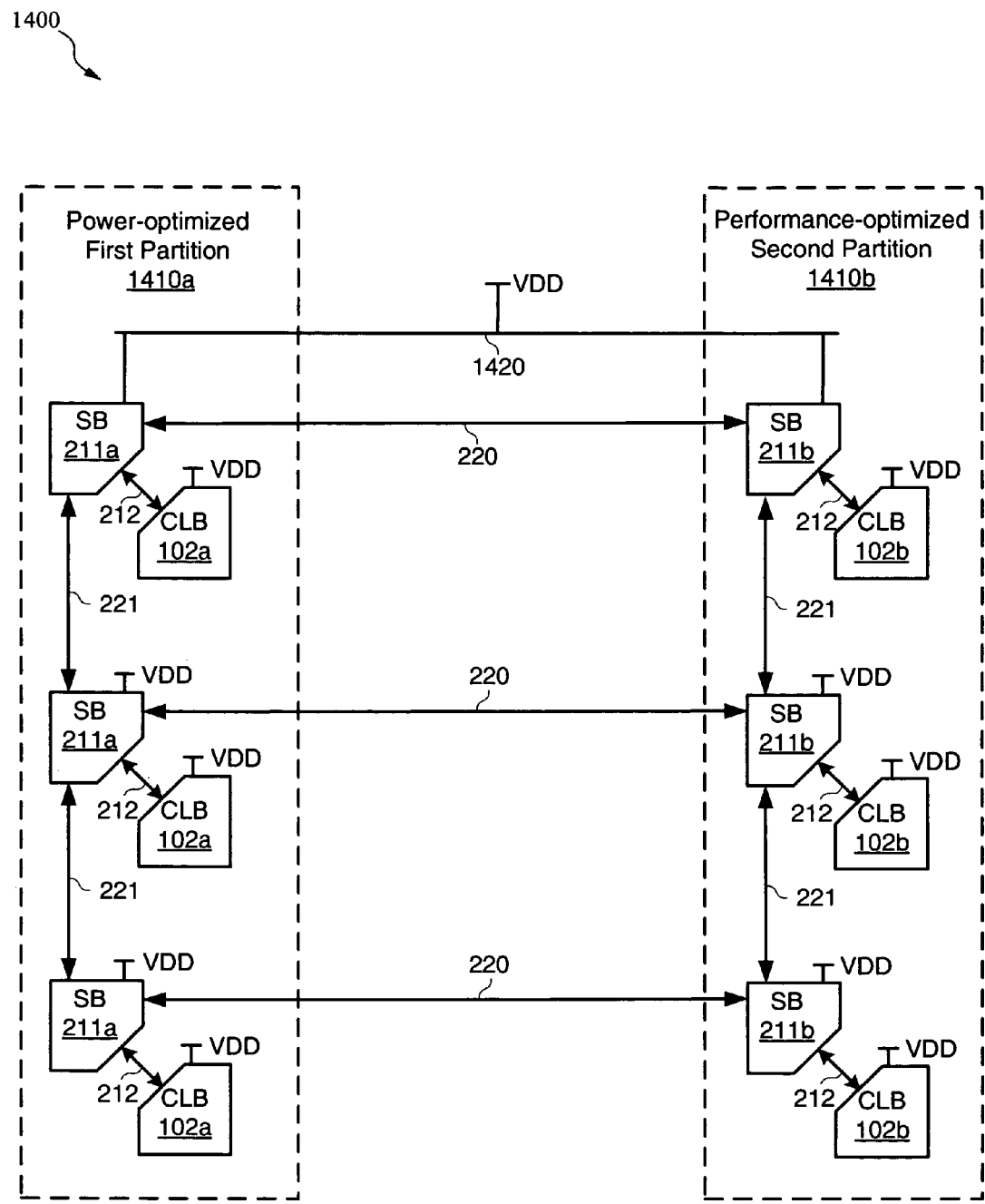
FIG. 14 is a simplified block diagram of PLD including a first partition having resources fabricated with low-power transistors and including a second partition having resources fabricated with high-performance transistors in accordance with second embodiments of the PLD of FIG. 3.

For example, FIG. 14 shows a PLD 1400 that is an exemplary second embodiment of PLD 300 of FIG. 3. PLD 1400 includes a power-optimized first partition 1410a, a performance-optimized second partition 1410b, and a power rail 1420. The power rail 1420 provides a supply voltage (VDD) to the power terminals of the CLBs 102a and switch blocks 211a of the power-optimized first partition 1410a, which is another embodiment of the power-optimized partition 310a of FIG. 3, and provides VDD to the power terminals of the CLBs 102b and switch blocks 211b of the performance-optimized second partition 1410b, which is another embodiment of the performance-optimized partition 310b of FIG. 3. The switch blocks 211a of the first partition 1410a are connected to the switch blocks 211b of the second partition 1410b via signal lines 220, which are represented collectively in FIG. 14. Further, although not shown for simplicity, for other embodiments, the first and second partitions 1410a and 1410b may include other resources such as, for example, block RAM, IOBs, embedded processors, and so on.

Although not shown in FIG. 14 for simplicity, each of CLBs 102a-102b and switch blocks 211a-211b may also include a power connection to ground potential. For exemplary embodiments described herein, VDD has a value of approximately 1.2 volts, although for other embodiments VDD may be of suitable values. Further, VDD may be generated in any suitable manner. For example, for some embodiments, PLD 1400 may include a well-known voltage supply circuit (not shown for simplicity) to generate VDD. For other embodiments, VDD may be generated off-chip.

In accordance with the second embodiments of the present invention, the CLBs 102a and/or switch blocks 211a of the power-optimized first partition 1410a are implemented using low-power transistors (not shown for simplicity), and the CLBs 102b and switch blocks 211b of the performance-optimized second partition 1410b are implemented using high-performance transistors. More specifically, the transistors that implement resources of the first partition 1410a are fabricated to exhibit lower power consumption than the transistors that implement resources of the second partition 1410b, and the transistors that implement the resources of the second partition 1410b are fabricated to exhibit faster switching speeds and shorter gate delays than the transistors that implement resources of the first partition 1410a. In this manner, the resources of the first partition 1410a consume minimal power, and the resources of the second partition 1410b are suitable for implementing the critical timing paths of a user design. Thus, when configuring PLD 1400, logic portions of a user design containing non-critical timing paths are mapped to the resources of the first partition 1410a, and logic portions of the user design containing critical timing paths are mapped to the resources of the second partition 1410b, for example, as described above with respect to FIG. 4, thereby reducing overall power consumption (e.g., as compared to a homogeneous PLD architecture) without sacrificing performance.

Figure 15:
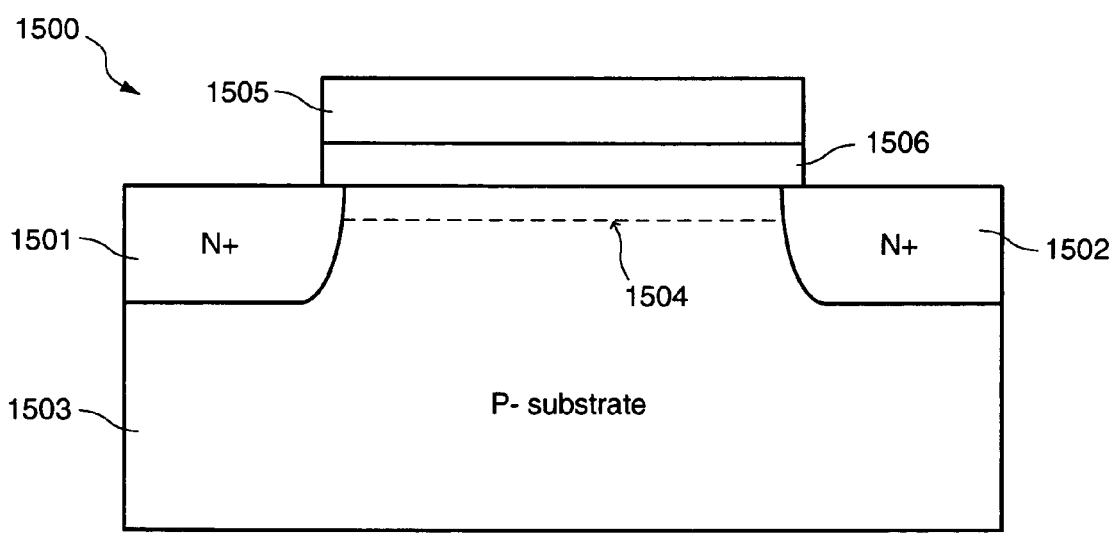
FIG. 15 is a cross-sectional view of a transistor that may be used to implement the resources of the PLD of FIG. 14.

The implementation of some embodiments of PLD 1400 for the present invention is described below with respect to the exemplary NMOS transistor 1500 depicted in FIG. 15. NMOS transistor 1500 includes an n+ type source region 1501 and an n+ type drain region 1502 formed in a suitable p-type substrate 1503 with a channel region 1504 extending between source 1501 and drain 1502. A gate 1505 formed of a suitable material such as polysilicon is insulated from substrate 1503 by a layer of gate oxide 1506. When the voltage applied between gate 1505 and source 1501 (Vgs) exceeds the threshold voltage (VT) of transistor 1500, transistor 1500 turns on. Conversely, when Vgs is less than VT, transistor 1500 is non-conductive.

For some embodiments of PLD 1400, transistors such as transistor 1500 that are used to implement the resources of the first partition 1410a may be fabricated to have relatively high threshold voltages (VT), as compared with the transistors that are fabricated to implement the resources of the second partition 1410b, by manipulating the dopant concentrations in p-substrate 1503 and/or in channel region 1504 in a well-known manner. As known in the art, increasing the VT of transistor 1500 reduces the transistor's sub-threshold leakage current and thus reduces power consumption, but also reduces the switching speed and increases the gate delay of transistor 1500.

For other embodiments of PLD 1400, the transistors 1500 that implement the resources of the first partition 1410a may be fabricated to have relatively thick gate oxides, as compared with the transistors that implement the resources of the second partition 1410b. As known in the art, increasing the thickness of gate oxide layer 1506 of transistor 1500 not also reduces the transistor's gate leakage current but also increases its VT, and therefore reduces its power consumption as compared to the transistors that implement the CLB and switch block resources of the second partition 1410b.

Although effective in reducing the power consumption of the first partition 1410a, as compared to the second partition 1410b, fabricating high-VT and/or thick oxide transistors for only the first partition 1410a while fabricating transistors having other VTs and/or gate oxide thicknesses requires additional processing steps, and therefore increases manufacturing costs. Thus, for other embodiments of PLD 1400, the transistors that implement the CLB and switch block resources of the first partition 1410a may be fabricated to have narrower channel widths and/or longer channels than the transistors that implement the CLB and switch block resources of the second partition 1410b so that the first partition 1410a consumes less power than the second partition 1410b. For still other embodiments, groups of transistors that form resources in the first partition 1410a may be placed in one or more separate well regions, and the well regions may be biased with a suitable bias voltage to reduce the sub-threshold leakage current of all the transistors in the well region(s). More specifically, for NMOS transistors that implement resources of the first partition 1410a, the p– well regions that house the NMOS transistors may be biased with a lower (e.g., less positive) voltage that is used to bias the NMOS transistors that implement resources of the second partition 1410b, and for PMOS transistors that implement resources of the first partition 1410a, the n– well regions that house the PMOS transistors may be biased with a higher (e.g., more positive) voltage that is used to bias the PMOS transistors that implement resources of the second partition 1410b.

Figure 16A:
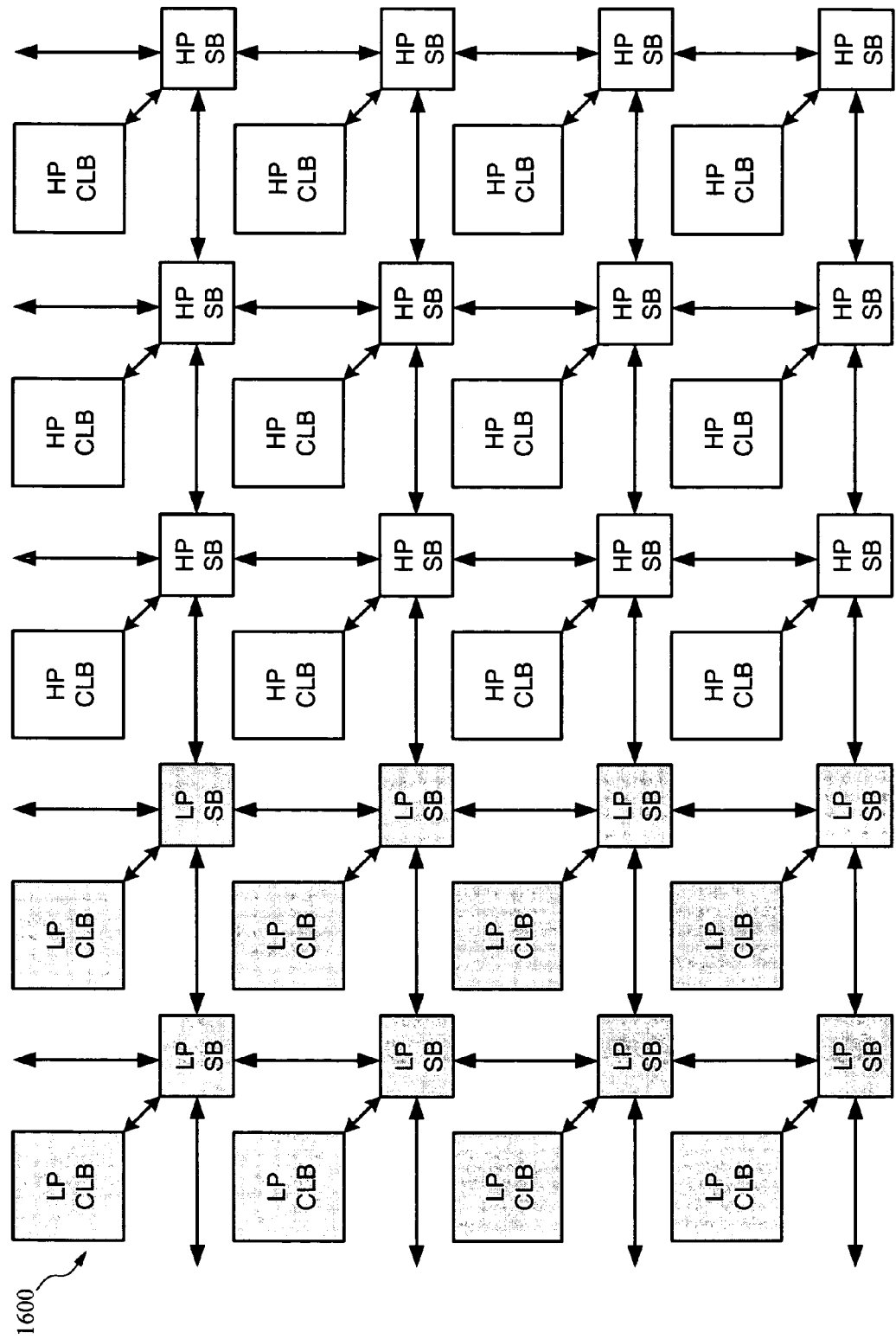
FIG. 16A is simplified block diagram illustrating the layout of low-power resources and high-performance resources for one embodiment of the PLD of FIG. 14.
Figure 16B:
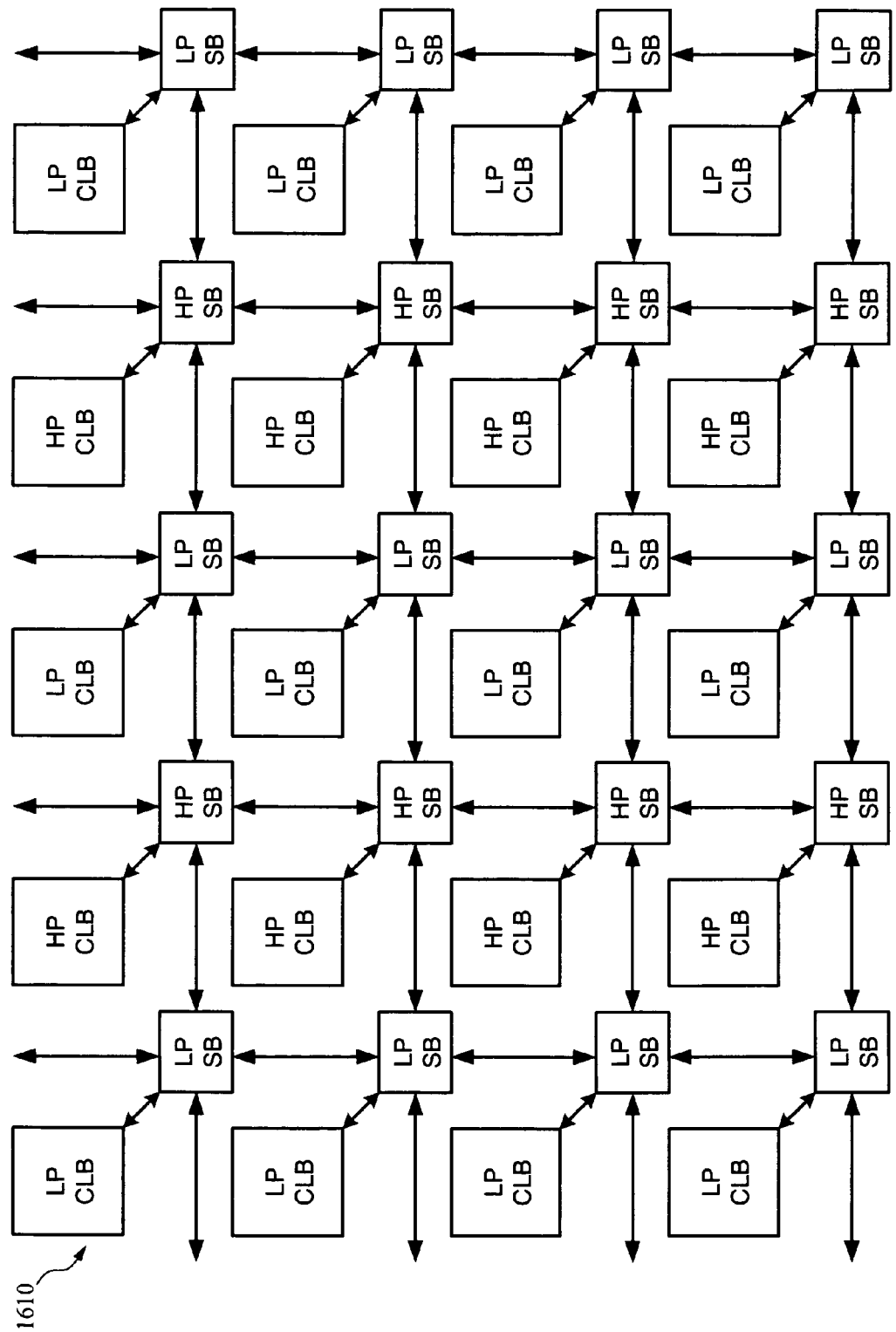
FIG. 16B is simplified block diagram illustrating the layout of low-power resources and high-performance resources for another embodiment of the PLD of FIG. 14.
Figure 16C:
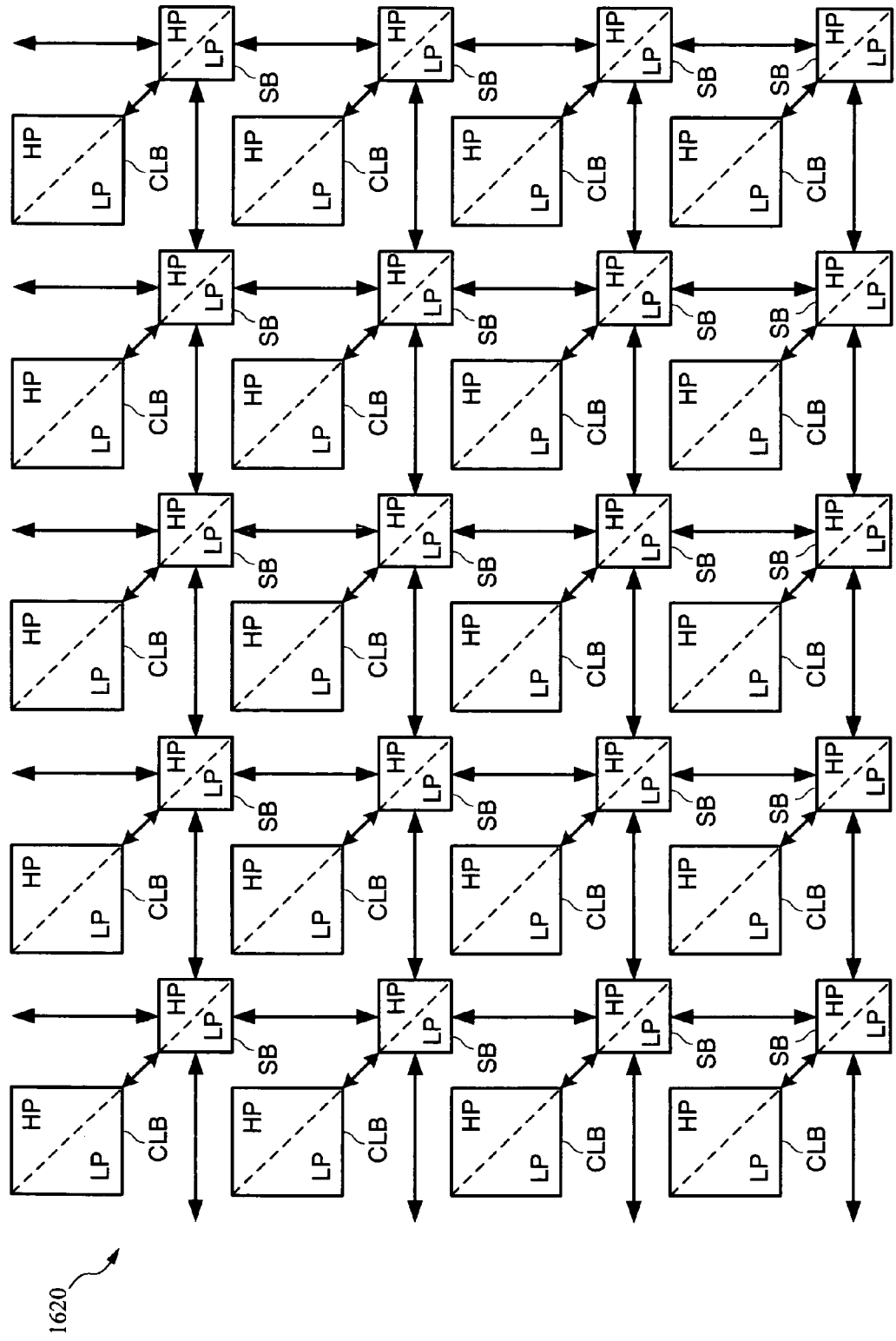
FIG. 16C is simplified block diagram illustrating the layout of low-power resources and high-performance resources for yet another embodiment of the PLD of FIG. 14.

Referring again to FIG. 14, the power-optimized first partition 1410a and the performance optimized second partition 1410b may each include any suitable number of CLBs, switch blocks, and other resources (e.g., such as IOBs, block RAM, embedded processors, and so on) positioned in any suitable arrangement. For some embodiments, the low-power first partition 1410a may include a number of adjacent columns of low-power CLBs (LP CLB) and low-power switch blocks (LP SB), and the high-performance second partition 1410b may include a number of adjacent columns of high-performance CLBs (HP CLB) and high-performance switch blocks (HP SB), as depicted by the exemplary PLD architecture 1600 of FIG. 16A. For other embodiments, a number of columns of low-power CLBs (LP CLB) and low-power switch blocks (LP SB) associated with the first partition 1410a may be interleaved with a number of columns of high-performance CLBs (HP CLB) and high-performance switch blocks (HP SB) associated with the second partition 1410b, as depicted by the exemplary PLD architecture 1610 of FIG. 16B. For still other embodiments, resources of the first and second partitions 1410a-1410b may be intermingled such that within each CLB and switch block, some of the logic gates are implemented using low-power transistors (e.g., transistors fabricated to exhibit low power dissipation suitable for reducing overall power consumption of the PLD), while other logic gates are implemented using high-performance transistors (e.g., transistors fabricated to exhibit high switching speeds and short gate delays suitable for accommodating critical timing paths of the user design), for example, as depicted in FIG. 16C. In this manner, each CLB and SB pair may include both low-power (LP) resources and high-performance (HP) resources, thereby providing users with additional flexibility in balancing power concerns with performance concerns. For the exemplary embodiments of FIGS. 16A-16C, the critical timing portions of a user design may be mapped to the HP resources and the non-critical timing portions of the user design may be mapped to the LP resources in the manner described above with respect to FIG. 4.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. An integrated circuit, comprising:
a first partition comprising a plurality of first configurable logic blocks, wherein the first configurable logic blocks are optimized for low power consumption;
a second partition comprising a plurality of second configurable logic blocks, wherein the second configurable logic blocks are optimized for high performance;
a first power rail to provide a low supply voltage to the first configurable logic blocks of the first partition; and
a second power rail to provide a high supply voltage, the high supply voltage greater than the low supply voltage, to the second configurable logic blocks of the second partition.

2. The integrated circuit of claim 1, wherein the first configurable logic blocks implement non-critical timing portions of a user design, and
wherein the second configurable logic blocks implement critical timing portions of the user design.

3. The integrated circuit of claim 1, wherein each of the first configurable logic blocks is implemented using low-power transistors and each of the second configurable logic blocks is implemented using high-performance transistors.

4. The integrated circuit of claim 3, wherein the low-power transistors have an effective threshold voltage that is higher than a threshold voltage of the high-performance transistors.

5. The integrated circuit of claim 3, wherein the low-power transistors have gate oxide layers that are thicker than gate oxide layers of the high-performance transistors.

6. The integrated circuit of claim 1, further comprising:
a plurality of level-shifter circuits, each configured to convert a low-voltage signal output from the first partition into a high-voltage signal for input to the second partition.

7. The integrated circuit of claim 6, wherein each level-shifter circuit is further configured to convert a high-voltage signal output from the second partition into a low-voltage signal for input to the first partition.

8. The integrated circuit of claim 1, wherein the first partition comprises a plurality of first columns each including a first number of the first configurable logic blocks and the second partition comprises a plurality of second columns each including a second number of the second configurable logic blocks, wherein the first and second columns are selectively interleaved across the integrated circuit.

9. The integrated circuit of claim 8, wherein the integrated circuit further comprises:
a plurality of columns of programmable level-shifter circuits, each column of programmable level-shifter circuits coupled between a corresponding pair of columns of configurable logic blocks, wherein the programmable level shifter circuits in each column are configured to selectively adjust the voltage levels of signals transmitted between the corresponding pair of columns of configurable logic blocks in response to a level-shifting control signal.

10. The integrated circuit of claim 9, wherein each programmable level-shifter circuit comprises:
a level-shifter having an input to receive an output signal from a first column of configurable logic blocks in the corresponding pair, and an output; and
a multiplexer having a first input coupled to the output of the level-shifter, a second input to receive the output signal, a control terminal to receive the level-shifting control signal, and an output to provide an input signal to a second column of configurable logic blocks in the corresponding pair.

11. The integrated circuit of claim 9, wherein each programmable level-shifter circuit comprises:
a first multiplexer having a first input to receive a first output signal from a first column of configurable logic blocks in the corresponding pair, a second input, a control terminal to receive the level-shifting control signal, and an output to provide a first input signal to a second column of configurable logic blocks in the corresponding pair;
a second multiplexer having a first input to receive a second output signal from the second column of configurable logic blocks in the corresponding pair, a second input, a control terminal to receive the level-shifting control signal, and an output to provide a second input signal to the first column of configurable logic blocks in the corresponding pair;
a third multiplexer having a first input to receive the second output signal, a second input to receive the first output signal, a control terminal to receive the level-shifting control signal, and an output; and
a level shifter having an input coupled to the output of the third multiplexer and having an output coupled to the second inputs of the first and second multiplexers.

12. An integrated circuit, comprising:
a first power rail for providing a low supply voltage;
a second power rail for providing a high supply voltage, the high supply voltage greater than the low supply voltage;
a plurality of partitions, each comprising:
a number of configurable logic blocks, each having a power terminal; and
means for selectively connecting the configurable logic blocks in the partition to one of the first power rail and the second power rail; and
a plurality of programmable level-shifter circuits, each positioned between a corresponding pair of configurable logic blocks and configured to selectively level-shift signals transmitted between the corresponding pair of configurable logic blocks in response to a corresponding level-shifting control signal.

13. The integrated circuit of claim 12, wherein the means for selectively connecting comprises:
a plurality of first fuses, each coupled between the power terminals of the configurable logic blocks in a corresponding partition and the first power rail; and
a plurality of second fuses, each coupled between the power terminals of the configurable logic blocks the corresponding partition and the second power rail.

14. The integrated circuit of claim 12, wherein the means for selectively connecting comprises:
a plurality of voltage select circuits, each having a first terminal coupled to the first power rail, a second terminal coupled to the second power rail, a third terminal coupled to the power terminals of the configurable logic blocks in a corresponding partition, and a control terminal to receive a corresponding voltage control signal.

15. The integrated circuit of claim 12, wherein connecting a selected configurable logic block to the first power rail optimizes the selected configurable logic block for low power consumption, and connecting the selected configurable logic block to the second power rail optimizes the selected configurable logic block for high performance.

16. The integrated circuit of claim 15, wherein the selected configurable logic blocks optimized for low power consumption implement non-critical timing portions of a user design, and wherein the selected configurable logic blocks optimized for high performance implement critical timing portions of the user design.

17. The integrated circuit of claim 12, wherein each partition further comprises:

a plurality of switch blocks, each having a power terminal coupled to the means for selectively connecting, and each having signal lines coupled to a corresponding configurable logic block.

* * * * *